(12) United States Patent
Washio et al.

(10) Patent No.: US 11,062,883 B2
(45) Date of Patent: Jul. 13, 2021

(54) ATOMIC LAYER DEPOSITION APPARATUS

(71) Applicant: THE JAPAN STEEL WORKS, LTD., Tokyo (JP)

(72) Inventors: Keisuke Washio, Yokohama (JP); Masao Nakata, Yokohama (JP)

(73) Assignee: THE JAPAN STEEL WORKS, LTD., Tokyo (JP)

(*) Notice: Subject to any disclaimer, the term of this patent is extended or adjusted under 35 U.S.C. 154(b) by 254 days.

(21) Appl. No.: 16/032,033

(22) Filed: Jul. 10, 2018

(65) Prior Publication Data
US 2019/0019657 A1    Jan. 17, 2019

(30) Foreign Application Priority Data
Jul. 11, 2017 (JP) .............................. JP2017-135329

(51) Int. Cl.
| | |
|---|---|
| *H01J 37/32* | (2006.01) |
| *C23C 16/455* | (2006.01) |
| *H01L 21/02* | (2006.01) |
| *H01L 21/28* | (2006.01) |

(52) U.S. Cl.
CPC .. *H01J 37/32559* (2013.01); *C23C 16/45536* (2013.01); *C23C 16/45544* (2013.01); *H01J 37/32605* (2013.01); *H01J 2237/327* (2013.01); *H01J 2237/3321* (2013.01); *H01J 2237/3323* (2013.01); *H01L 21/0228* (2013.01); *H01L 21/02178* (2013.01); *H01L 21/02274* (2013.01); *H01L 21/28194* (2013.01)

(58) Field of Classification Search
USPC ..................................................... 118/723 E
See application file for complete search history.

(56) References Cited

U.S. PATENT DOCUMENTS

| | | | |
|---|---|---|---|
| 6,700,089 B1* | 3/2004 | Hirooka | H01J 37/32568 156/345.27 |
| 9,175,377 B2 | 11/2015 | Ishihara | |
| 2006/0266852 A1* | 11/2006 | Choi | C23C 16/45565 239/548 |
| 2006/0280868 A1 | 12/2006 | Kato et al. | |
| 2012/0031748 A1 | 2/2012 | Ishihara | |

FOREIGN PATENT DOCUMENTS

| | | |
|---|---|---|
| JP | 2001-316797 A | 11/2001 |
| JP | 2006-351655 A | 12/2006 |
| JP | 2009-062579 A | 3/2009 |
| JP | 2012-052221 A | 3/2012 |
| JP | 2014-133927 A | 7/2014 |

\* cited by examiner

*Primary Examiner* — Ram N Kackar
(74) *Attorney, Agent, or Firm* — SGPatents PLLC

(57) ABSTRACT

A film quality of a film formed on a substrate is improved. A plasma atomic layer deposition apparatus has a lower electrode holding the substrate, and an upper electrode having an opposite surface opposed to the lower electrode and generating plasma discharge between the upper electrode and the lower electrode. Further, the plasma atomic layer deposition apparatus has a conductive deposition preventing member fixed to the opposite surface of the upper electrode by a plurality of screws, and other conductive deposition preventing member fixed to the conductive deposition preventing member by a plurality of others screws. At this time, in a plan view, the plurality of screws and the plurality of other screws are arranged so as not to overlap each other.

8 Claims, 16 Drawing Sheets

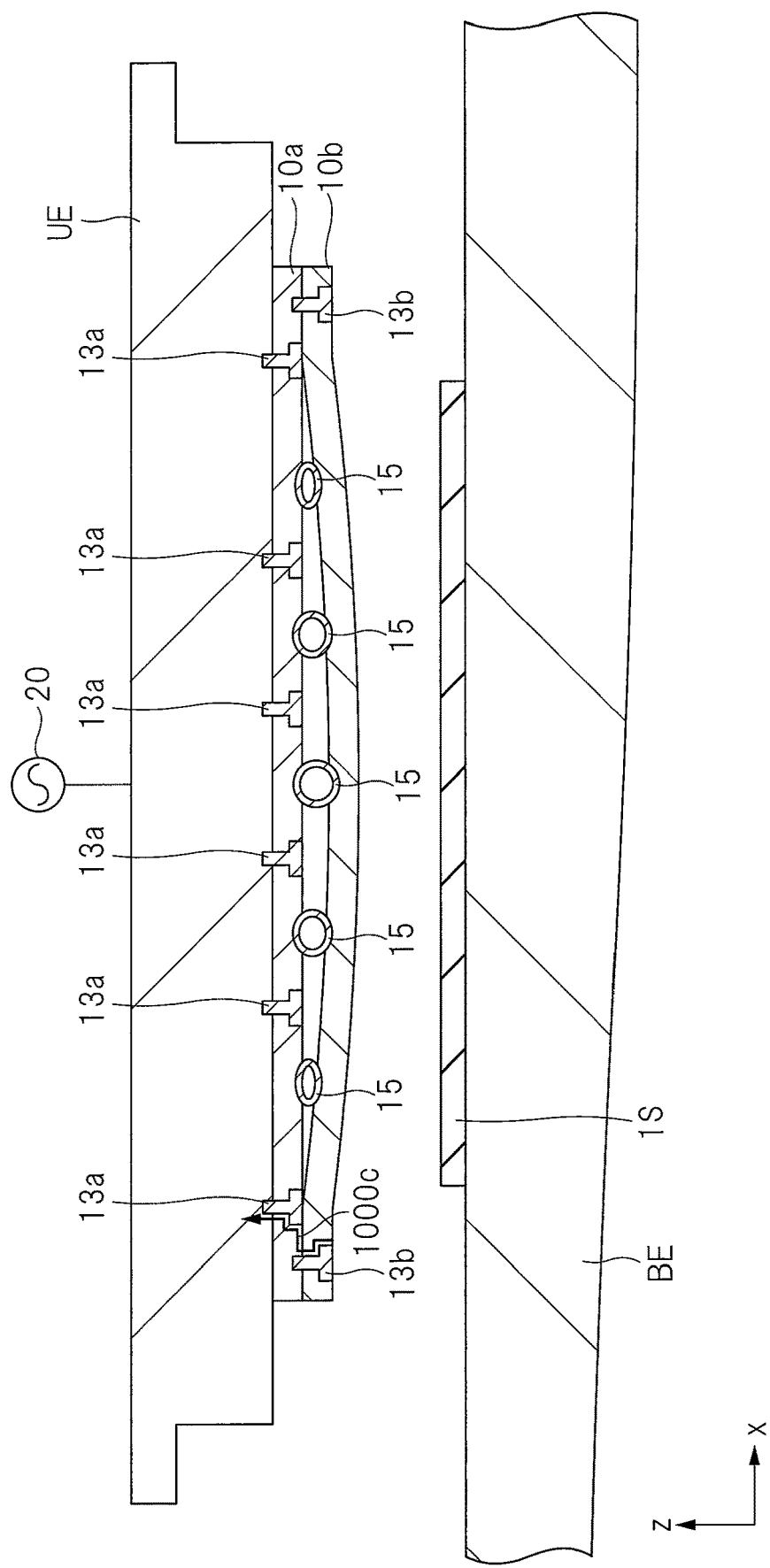

ATOMIC LAYER DEPOSITION APPARATUS

CROSS-REFERENCE TO RELATED APPLICATION

The present application claims priority from Japanese Patent Application No. 2017-135329 filed on Jul. 11, 2017, the content of which is hereby incorporated by reference into this application.

TECHNICAL FIELD OF THE INVENTION

The present invention relates to an atomic layer deposition technique.

BACKGROUND OF THE INVENTION

Japanese Patent Application Laid-Open Publication No. 2006-351655 (Patent Document 1) describes a technique in a film-forming apparatus using a CVD (Chemical Vapor Deposition) method or a sputtering method, the technique using a deposition preventing plate and covering deposition materials deposited on an inner wall of a chamber with an amorphous film.

Japanese Patent Application Laid-Open Publication No. 2009-62579 (Patent Document 2) describes a technique of arranging a plurality of deposition preventing plates so as to correspond to a plurality of side surfaces in a film-forming chamber, dividing the deposition preventing plate into a plurality of pieces, and providing a space between the adjacent deposition preventing plates.

Japanese Patent Application Laid-Open Publication No. 2012-52221 (Patent Document 3) describes a technique of controlling, based on a pressure value of a sputtering space, a flow-rate ratio between a flow rate of a gas introduced into the sputtering space and a flow rate of a gas introduced into a space between an inner wall of a vacuum chamber and a deposition preventing plate.

Japanese Patent Application Laid-Open Publication No. 2014-133927 (Patent Document 4) describes a technique of arranging a pair of deposition preventing plates having a plurality of through holes formed therein closely to an inner wall of a processing chamber.

Japanese Patent Application Laid-Open Publication No. 2001-316797 (Patent Document 5) describes a technique of attaching a deposition preventing member, which prevents film adhesion on a surface of a substrate carrier, to a base surface of the substrate carrier.

SUMMARY OF THE INVENTION

An atomic layer deposition method is a film-forming method for forming a film on a substrate in a unit of an atomic layer by alternately supplying a source gas and a reaction gas onto the substrate. Since the film is formed in the unit of the atomic layer, the atomic layer deposition method has advantages such as excellent step coverage and excellent film thickness controllability. Meanwhile, in an atomic layer deposition apparatus for embodying the atomic layer deposition method, as an opposite side of the advantage of the excellent step coverage, the film is easily formed even in a part where the film removal is difficult. Accordingly, in the atomic layer deposition apparatus, there is a concern about deterioration in a film quality of the film formed on the substrate due to occurrence of foreign substances resulting from peeling of the film formed in the part where the film removal is difficult.

Other object and novel characteristics will be apparent from the description of the present specification and the accompanying drawings.

A plasma atomic layer deposition apparatus according to one embodiment has a first electrode (lower electrode) holding a substrate and a second electrode (upper electrode) having an opposite surface opposed to the first electrode and generating plasma discharge between the second electrode itself and the first electrode. Further, the plasma atomic layer deposition apparatus according to one embodiment has a first conductive deposition preventing member fixed to the opposite surface of the second electrode by a plurality of first connecting members and a second conductive deposition preventing member fixed to the first conductive deposition preventing member by a plurality of second connecting members. At this time, in a plan view, the plurality of first connecting members and the plurality of second connecting members are arranged so as not to overlap each other.

In the plasma atomic layer deposition apparatus according to one embodiment, a film quality of a film formed on a substrate can be improved.

BRIEF DESCRIPTIONS OF THE DRAWINGS

FIG. 18 is a schematic view showing principal components of a plasma atomic layer deposition apparatus according to a third embodiment.

DESCRIPTIONS OF THE PREFERRED EMBODIMENTS

Figure 1:
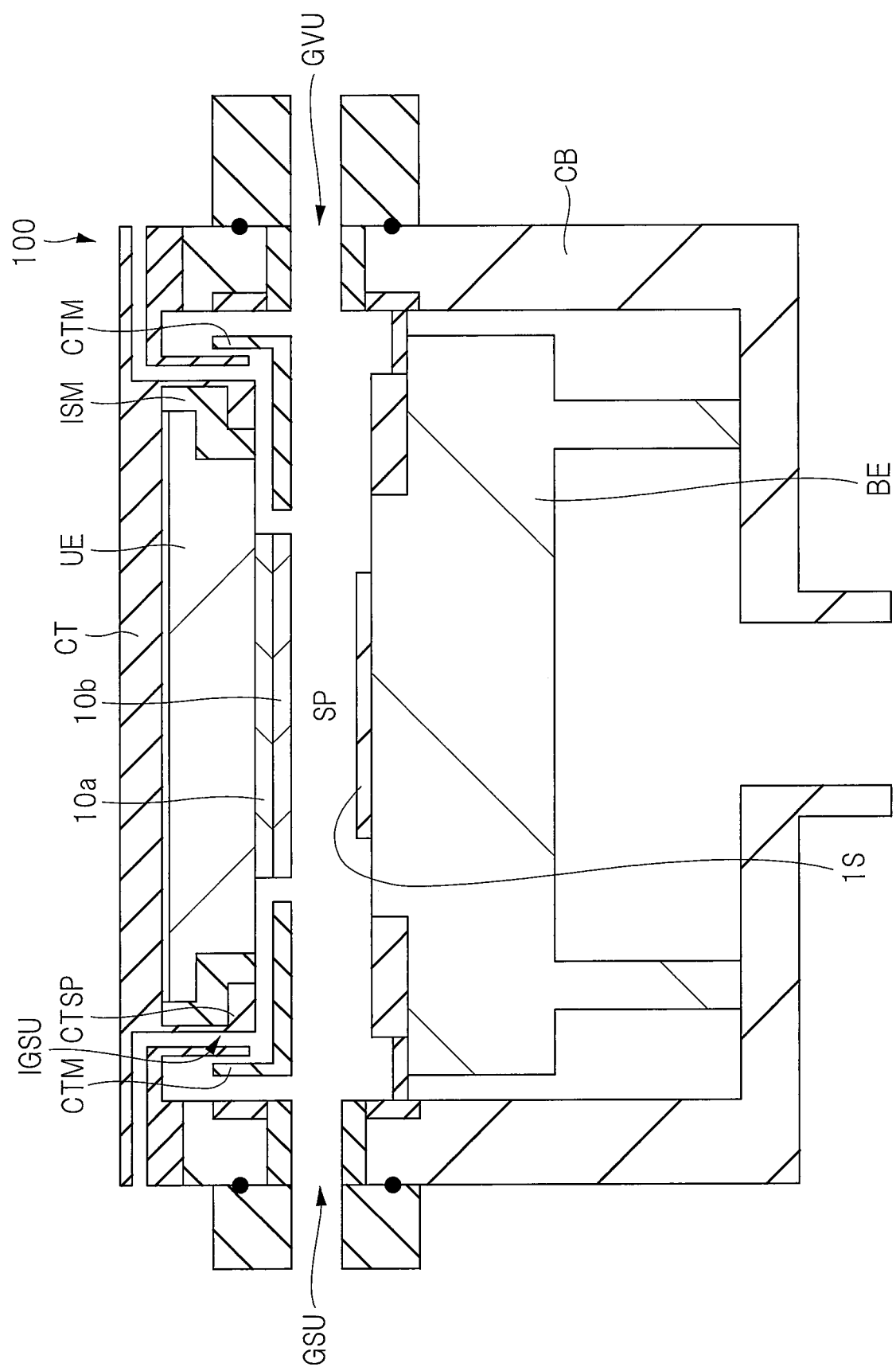
FIG. 1 is a cross-sectional view schematically showing an entire configuration of a plasma atomic layer deposition apparatus according to a first embodiment.

The same components are denoted by the same reference symbols in principle throughout all the drawings for describing the embodiments, and the repetitive description thereof will be omitted. Note that hatching is attached even to a plan view so as to make the drawings easy to see.

First Embodiment

<Unique Circumstances to Atomic Layer Deposition Apparatus>

For example, in a plasma CVD apparatus, plasma discharge is generated between a lower electrode and an upper electrode while a plurality of types of source gases are supplied to a space between the lower electrode holding a substrate and the upper electrode opposed to the lower electrode. In this manner, in the plasma CVD apparatus, a film is formed on a substrate by a chemical reaction with active species (radicals) caused by the plasma discharge. At this time, in the plasma CVD apparatus, the film is mainly formed in a region (discharge space) where the plasma discharge is formed. This is because a source gas having a property that makes the source gas difficult to diffuse is used as the source gas in the plasma CVD apparatus in order to allow the source gas to be localized in the discharge space, and because a film material is eventually formed after the active species (radicals) are generated from the plurality of types of source gases by the plasma discharge. Therefore, the plasma CVD apparatus tends to be difficult to form the film in a part that is distant from the discharge space (a part where the plasma discharge is not generated).

On the other hand, for example, in the plasma atomic layer deposition apparatus, the film is formed on the substrate in the unit of the atomic layer by alternately supplying a source gas and a reaction gas to a space between the lower electrode holding the substrate and the upper electrode opposed to the lower electrode, and generating the plasma discharge when the reaction gas is supplied. At this time, in the plasma atomic layer deposition apparatus, a film having the excellent step coverage can be formed by the formation of the film in the unit of the atomic layer. Particularly, in the plasma atomic layer deposition apparatus, in order to provide good step coverage, each of gases (source gas, purge gas, and reaction gas) is alternately supplied while using a material tending to diffuse as the source gas and securing time for sufficient diffusion of each of the gases in a film-forming container. Therefore, for example, the source gas and the reaction gas diffuse over not only the substrate but also corners of the film-forming container. Further, in the plasma atomic layer deposition apparatus, in addition to the film formation by the reaction of the source gas adhered to the substrate with the active species (radicals) formed by the plasma discharge of the reaction gas, the source gas and the reaction gas tend to react even in a state of no occurrence of the active species (radicals) formed by the plasma discharge. Therefore, in the plasma atomic layer deposition apparatus, the film is formed by the reaction between the source gas and the reaction gas even in a small space of the film-forming container where the plasma discharge is not generated. That is, the atomic layer deposition apparatus has features that are (1) the formation of the film in the unit of the atomic layer, (2) the spread of the source gas and the reaction gas over the corners of the film-forming container, and (3) the easiness in the reaction between the source gas and the reaction gas even in the part where the plasma discharge is not generated. As a result, the film is formed even in the small space.

As described above, the plasma atomic layer deposition apparatus has characteristics of the film formation on not only the substrate but also the corners of the film-forming container including the small space.

For example, in the plasma atomic layer deposition apparatus, the upper electrode is supported by, for example, an insulating supporting member. Since the film is formed over even the corners of the film-forming container in the plasma atomic layer deposition apparatus as described above, the film is also formed on the insulating supporting member. Once a film thickness of the film adhered to the insulating supporting member is large, a part of the adhered film peels off from the insulating supporting member, and becomes foreign substances. The foreign substances become a cause of deterioration in the film quality of the film formed on the substrate. Accordingly, in order to improve the film quality (quality) of the film formed on the substrate, it is required to remove the film adhered to the insulating supporting member.

Regarding this point, it is conceivable that the film adhered to the insulating supporting member is removed by, for example, dry etching in which a cleaning gas made of $NF_3$ or others is introduced. However, while the film is formed over even the corners of the film-forming container including the small space in the plasma atomic layer deposition apparatus, the dry etching using the cleaning gas removes the film only on a part where the plasma discharge is generated, and is difficult to spread the cleaning gas over the corners of the film-forming container including the small space. Further, for example, while an aluminum oxide film ($Al_2O_3$ film) can be exemplified as the film formed by the plasma atomic layer deposition apparatus, the aluminum oxide film is difficult to be removed by the dry etching. Therefore, in the plasma atomic layer deposition apparatus, it is difficult to remove the film formed over the corners of the film-forming container by the dry etching using the cleaning gas, and therefore, it is also difficult to use the dry etching for, for example, the removal of the film adhered to the insulating supporting member.

Accordingly, it is conceivable that the film adhered to the insulating supporting member is removed by, for example, wet etching after detaching the insulating supporting member fixing the upper electrode. However, once the insulating supporting member is attached again after the wet etching following the detachment of the insulating supporting member, an attachment position of the upper electrode is different from a previous attachment position. In this case, a state of the plasma discharge between the upper electrode and the lower electrode changes. That is, in the cleaning method by the wet etching after the detachment of the insulating supporting member, the attachment position of the insulating supporting member cannot be repeated, and, as a result, an attachment position of the upper electrode supported by the insulating supporting member changes, and therefore, a film-forming condition represented by the state of the plasma discharge undesirably changes. This case has a risk of change of the quality of the film formed on the substrate. Further, in the method of the removal of the film adhered to the insulating supporting member by the wet etching, it is required to take out the insulating supporting member after the film-forming container is released to the atmospheric pressure, and therefore, a working performance for maintenance is reduced.

From the above description, in the plasma atomic layer deposition apparatus, it is found out that it is particularly difficult to improve the film quality of the film formed on the substrate and remove the film adhered to the insulating supporting member supporting the upper electrode while not changing the film-forming condition. Accordingly, in the present first embodiment, a configuration in which the film is difficult to adhere to the insulating supporting member supporting the upper electrode is applied. Hereinafter, an entire configuration of the plasma atomic layer deposition apparatus including this configuration will be described first.

<Entire Configuration of Plasma Atomic Layer Deposition Apparatus>

FIG. 1 is a cross-sectional view schematically showing an entire configuration of a plasma atomic layer deposition apparatus 100 according to the first embodiment. The plasma atomic layer deposition apparatus 100 according to the present first embodiment is configured to form a film on a substrate 1S in a unit of an atomic layer by alternately supplying a source gas and a reaction gas. In this case, the substrate 1S can be heated in order to enhance a reaction activity.

In the present first embodiment, the plasma discharge is performed while using TMA (Tri-Methyl-Aluminum) as a source material in order to enhance the reaction activity. Since the plasma discharge is performed in the present first embodiment, a parallel plate electrode is used.

As shown in FIG. 1, the plasma atomic layer deposition apparatus 100 according to the present first embodiment has a film-forming container CB. A stage for holding the substrate 1S is arranged in this film-forming container BC, and this stage functions as a lower electrode BE. The stage is configured to include a heater so that a temperature of the substrate 1S can be adjusted. For example, in the case of the plasma atomic layer deposition apparatus 100 according to the present first embodiment, the substrate 1S held on the stage is heated at 50° C. to 200° C. And, the film-forming container CB is maintained in a vacuum state.

Next, as shown in FIG. 1, the film-forming container CB is provided with a gas supply unit GSU supplying the source gas, the purge gas, and the reaction gas, and a gas exhaust unit GVU exhausting the source gas, the purge gas, and the reaction gas. For example, the gas supply unit GSU and the gas exhaust unit GVU are provided at positions opposed to each other, and the gas supplied from the gas supply unit GSU passes a discharge space SP inside the film-forming container CB and is exhausted from the gas exhaust unit GVU.

Inside the film-forming container CB, an upper electrode UE is arranged so that a conductive deposition preventing member 10a and a conductive deposition preventing member 10b are attached to the upper electrode across the discharge space positioned above the substrate 1S mounted on the lower electrode BE. That is, the upper electrode UE is arranged so as to be opposed to the lower electrode BE, on which the substrate 1S is mounted, through the conductive deposition preventing member 10a and the conductive deposition preventing member 10b. A top plate CT is arranged above the upper electrode UE, and this top plate CT is provided with a top-plate supporting unit CTSP for supporting the upper electrode UE. Further, an insulating supporting member ISM is arranged so as to be in closely contact with the top-plate supporting unit CTSP, and the upper electrode UE is supported by this insulating supporting member ISM. As shown in FIG. 1, the plasma atomic layer deposition apparatus 100 according to the present first embodiment has an insulating deposition preventing member CTM made of an insulator being distant from and surrounding the upper electrode UE in a plan view, and the insulating deposition preventing member CTM is arranged so as to overlap the insulating supporting member ISM in a plan view.

Here, the term "plan view" described in the present specification is defined in a case of viewing a plane parallel to an upper surface of the lower electrode BE shown in FIG. 1 from a direction perpendicular to this plane. In other words, the term "plan view" described in the present specification is defined in a case of viewing a plane parallel to a lower surface of the upper electrode UE shown in FIG. 1 from a direction perpendicular to this plane.

Subsequently, as shown in FIG. 1, the top plate CT is provided with an inactive gas supply unit IGSU supplying an inactive gas such as nitrogen gas into the film-forming container CB. As described above, in addition to the gas supply unit GSU supplying the source gas, the purge gas, and the reaction gas, the inactive gas supply unit IGSU supplying the inactive gas is separately provided to the plasma atomic layer deposition apparatus 100 according to the present first embodiment.

<Configuration of Insulating Deposition Preventing Member>

Figure 2:
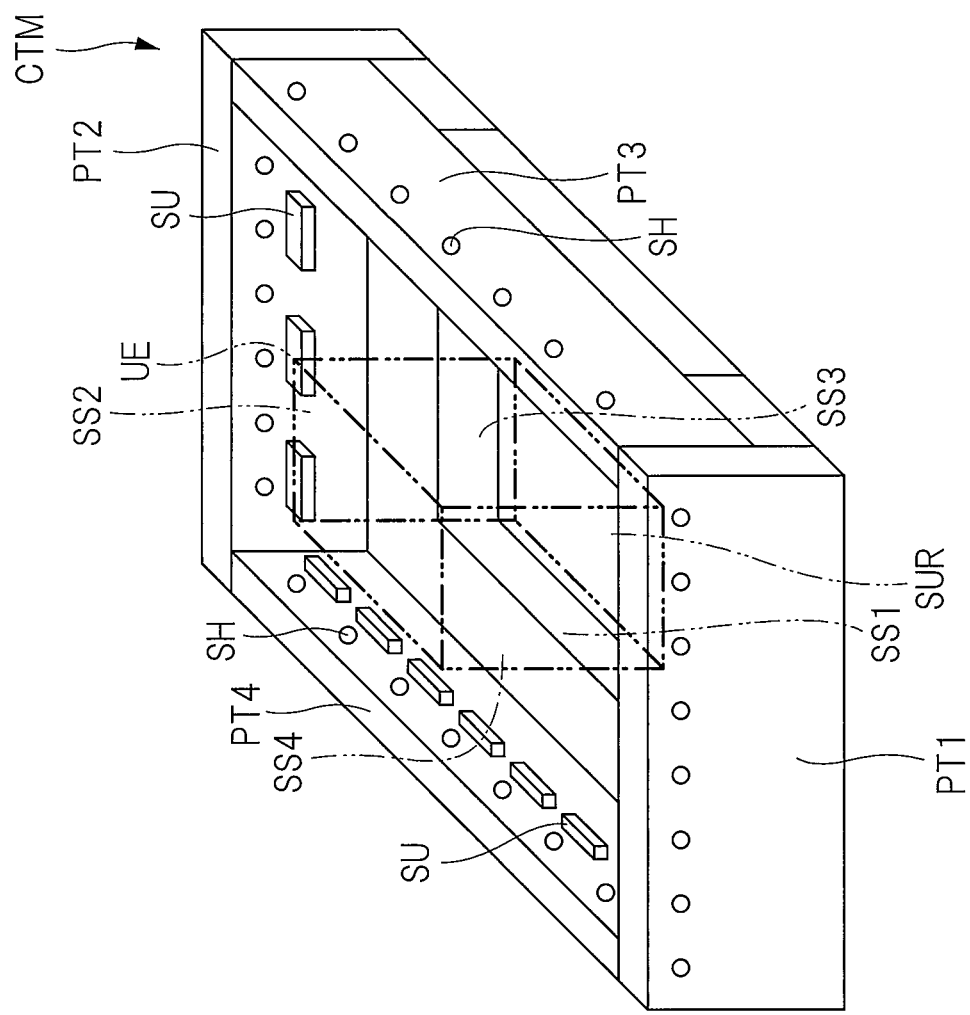
FIG. 2 is a diagram schematically showing a configuration of an insulating deposition preventing member according to the present first embodiment, which is provided so as to be distant from and surround an upper electrode.

Next, a configuration of the insulating deposition preventing member CTM according to the present first embodiment will be described. FIG. 2 is a diagram schematically showing the configuration of the insulating deposition preventing member CTM according to the present first embodiment, the insulating deposition preventing member being provided so as to be distant from and surround the upper electrode UE. In FIG. 2, the schematic configuration of the upper electrode UE is shown as a cuboid indicated by a two-dot chain line. The upper electrode UE shown in FIG. 2 has a surface SUR opposed to the lower electrode BE shown in FIG. 1 across the conductive deposition preventing member 10a (illustration is omitted in FIG. 2) and the conductive deposition preventing member 10b (illustration is omitted in FIG. 2), a side surface SS1 crossing the surface SUR, a side surface SS2 positioned on an opposite side of the side surface SS1, a side surface SS3 crossing the surface SUR and the side surface SS1, and a side surface SS4 positioned on an opposite side of the side surface SS3.

As shown in FIG. 2, the insulating deposition preventing member CTM according to the present first embodiment is configured to be distant from and surround the upper electrode UE. Specifically, the insulating deposition preventing member CTM according to the present first embodiment has a portion (part) PT1 opposed to the side surface SS1 of the upper electrode UE, a portion PT2 opposed to the side surface SS2 of the upper electrode UE, a portion PT3 opposed to the side surface SS3 of the upper electrode UE, and a portion PT4 opposed to the side surface SS4 of the upper electrode UE. Meanwhile, as shown in FIG. 2, in the insulating deposition preventing member CTM according to the present first embodiment, an opening is formed on a base portion of the insulating deposition preventing member CTM so as to expose the conductive deposition preventing member 10b (illustration is omitted in FIG. 2) attached to the surface SUR of the upper electrode UE. As a result, as shown in FIG. 2, each of the portions PT1 to PT4 of the insulating deposition preventing member CTM according to the present first embodiment is formed into an L shape having a horizontal portion and a vertical portion.

Here, a plurality of fixing holes SH in each of which a fixing member is buried and a plurality of convex portions SU each of which supports the fixing member are formed in each of the portions PT1 to PT4 of the insulating deposition preventing member CTM. In this manner, the deposition preventing member CTM is supported by the fixing members not shown in FIG. 2. As described above, the plasma atomic layer deposition apparatus according the present first embodiment is provided with the insulating deposition preventing member CTM surrounding the upper electrode UE.

<Advantage Based on Insulating Deposition Preventing Member>

The plasma atomic layer deposition apparatus 100 according to the present first embodiment is provided with, for example, the insulating deposition preventing member CTM so as to surround the upper electrode UE in a plan view as shown in FIG. 2. In this manner, the film can be prevented from being adhered to the insulating supporting member ISM provided in the periphery of the upper electrode UE. That is, the plasma atomic layer deposition apparatus 100 has characteristics that are (1) the formation of the film in the unit of the atomic layer, (2) the spread of the source gas and the reaction gas over even the corners of the film-forming container, and (3) the easiness in the reaction between the source gas and the reaction gas even in the part where the plasma discharge is not generated, and therefore, the film is adhered also to the insulating supporting member ISM provided at a part distant from the discharge space sandwiched between the upper electrode UE and the lower electrode BE. Particularly, the film is easy to adhere to the insulating supporting member ISM provided in the periphery of the upper electrode UE because the insulating supporting member is close to the discharge space. Therefore, in the present first embodiment, the insulating deposition preventing member CTM is provided so as to surround the periphery of the upper electrode UE in a plan view. In this manner, the adhesion of the film to the insulating supporting member ISM arranged in the periphery of the upper electrode UE can be effectively prevented.

Further, the plasma atomic layer deposition apparatus 100 according to the present first embodiment is provided with, for example, the insulating deposition preventing member CTM so as to be distant from and surround the upper electrode UE (the conductive deposition preventing members 10a and 10b) as shown in FIG. 2. In this manner, each of the upper electrode UE (the conductive deposition preventing members 10a and 10b) and the insulating deposition preventing member CTM can be prevented from being deformed and damaged. For example, while the upper electrode UE (the conductive deposition preventing members 10a and 10b) is made of a conductor, the insulating deposition preventing member CTM is made of an insulator (ceramic). Therefore, a thermal expansion rate of the upper electrode UE (the conductive deposition preventing members 10a and 10b) and a thermal expansion rate of the insulating deposition preventing member CTM are largely different from each other. In this case, for example, when the insulating deposition preventing member CTM is formed so as to be in closely contact to and surround the upper electrode UE (the conductive deposition preventing members 10a and 10b), there is a risk of distortion, and thus, deformation in each of the upper electrode UE (the conductive deposition preventing members 10a and 10b) and the insulating deposition preventing member CTM because of the difference between the thermal expansion rate of the upper electrode UE (the conductive deposition preventing members 10a and 10b) and the thermal expansion rate of the insulating deposition preventing member CTM. And, the large distortion causes a risk of damage particularly on the insulating deposition preventing member CTM made of ceramic. Therefore, in the present first embodiment, the insulating deposition preventing member CTM is provided so as to, for example, be distant from and surround the upper electrode UE (the conductive deposition preventing members 10a and 10b) as shown in FIG. 1. In other words, a space is provided between the upper electrode UE (the conductive deposition preventing members 10a and 10b) and the insulating deposition preventing member CTM. In this manner, in the plasma atomic layer deposition apparatus 100 according to the present first embodiment, even when the inside of the film-forming container is heated, each volume expansion of the upper electrode UE (the conductive deposition preventing members 10a and 10b) and the insulating deposition preventing member CTM is absorbed by this space, and therefore, the deformation and the damage of the upper electrode UE (the conductive deposition preventing members 10a and 10b) and the insulating deposition preventing member CTM can be suppressed.

<Advantage Based on Inactive Gas Supply Unit>

However, the film is undesirably formed in the space between the upper electrode UE (the conductive deposition preventing members 10a and 10b) and the insulating deposition preventing member CTM because of the characteristics of the plasma atomic layer deposition apparatus such as the formation of the film even over the corners inside the film-forming container including the small space by the formation of the space between the upper electrode UE (the conductive deposition preventing members 10a and 10b) and the insulating deposition preventing member CTM. That is, from a viewpoint of achievement of maintenance free in the insulating supporting member ISM by almost completely preventing the adhesion of the film to the insulating supporting member ISM supporting the upper electrode UE, the configuration in which the space is provided between the upper electrode UE (the conductive deposition preventing members 10a and 10b) and the insulating deposition preventing member CTM is not sufficient, and therefore, further contrivance is required. Accordingly, in the present first embodiment, contrivance has been made in order to almost completely prevent the adhesion of the film to the insulating supporting member ISM supporting the upper electrode UE while the space is provided between the upper electrode UE (the conductive deposition preventing members 10a and 10b) and the insulating deposition preventing member CTM.

Specifically, the plasma atomic layer deposition apparatus according to the present first embodiment has, for example, the inactive gas supply unit IGSU supplying the inactive gas to the space between the upper electrode UE (the conductive deposition preventing members 10a and 10b) and the insulating deposition preventing member CTM as shown in FIG. 1. In this manner, in the plasma atomic layer deposition apparatus 100 according to the present first embodiment, the inactive gas supplied from the inactive gas supply unit IGSU is filled into a space between the insulating deposition preventing member CTM and the upper electrode UE, a space between the insulating supporting member ISM and the upper electrode UE, and a space between the conductive deposition preventing members 10a, 10b and the insulating deposition preventing member CTM. Therefore, by the inactive gas supplied from the inactive gas supply unit IGSU, the source gas and the reaction gas are prevented from infiltrating into the space formed between the insulating deposition preventing member CTM and the upper electrode UE (the conductive deposition preventing members 10a and 10b). As a result, formation of an unnecessary film in the space between the upper electrode UE (the conductive deposition preventing members 10a and 10b) and the insulating deposition preventing member CTM can be suppressed.

Further, in the plasma atomic layer deposition apparatus 100 according to the present first embodiment, for example, the inactive gas supply unit IGSU supplying the inactive gas is differently provided from the gas supply unit GSU supplying the source gas and the reaction gas into the film-forming container as shown in FIG. 1. In this manner, particularly, a position at which the inactive gas supply unit IGSU is to be set can be designed so that the inactive gas can be effectively supplied to a part where the adhesion of the unnecessary film is to be prevented regardless of a setting position of the gas supply unit GSU. Further, the inactive gas can be supplied in a different passage from that of the gas supply unit GSU supplying the source gas and the reaction gas, and therefore, adverse influences of a flow of the inactive gas can be suppressed on flows of the source gas and the reaction gas supplied to the discharge space SP. As a result, in the plasma atomic layer deposition apparatus according to the present first embodiment, reduction in uniformity of the source gas and the reaction gas on the substrate 1S due to the supply of the inactive gas into the film-forming container can be suppressed. Accordingly, reduction in uniformity of the film formed on the substrate 1S can be prevented even when the inactive gas is supplied.

<Margin for Further Improvement>

As described above, the plasma atomic layer deposition apparatus 100 according to the present first embodiment is provided with the insulating deposition preventing member CTM so as to surround the periphery of the upper electrode UE in a plan view. In this manner, in the plasma atomic layer deposition apparatus 100 according to the present first embodiment, the film adhesion to the insulating supporting member ISM in the periphery of the upper electrode UE can be effectively prevented. This result leads to reduction in such requirement as detaching the insulating supporting member ISM that fixes the upper electrode UE and removing the film adhered to the insulating supporting member ISM by the wet etching. In the plasma atomic layer deposition apparatus 100 according to the present first embodiment, it is thought that this manner can suppress the change in the film-forming conditions due to change in the attachment position of the upper electrode supported by the insulating supporting member ISM, so that this suppression can suppress the change in the quality of the film formed on the substrate 1S. However, the present inventors have newly found that the above-described measures are insufficient from the viewpoint of the suppression of the change in the film-forming conditions due to the change in the attachment position of the upper electrode, and therefore, this point will be described.

For example, even if the adhesion of the film to the insulating supporting member ISM can be prevented by the formation of the insulating deposition preventing member CTM in FIG. 1, there is a large possibility of peeling off of the adhered film to cause foreign substances by the adhesion of the film to an opposite surface itself of the upper electrode UE opposed to the substrate 1S. And, the foreign substances become a cause of deterioration in the film quality of the film formed on the substrate 1S. Therefore, from the viewpoint of the suppression of the deterioration in the film quality of the film formed on the substrate 1S, only the measure to prevent the adhesion of the film to the insulating supporting member ISM is not sufficient, and a measure to prevent the adhesion of the film to the opposite surface itself of the upper electrode UE opposed to the substrate 1S is also required.

Regarding this point, an approach to arranging a conductor deposition preventing member on the opposite surface of the upper electrode UE opposed to the substrate 1S is considered. However, this conductor deposition preventing member is fixed to the upper electrode UE by, for example, a screw. Regarding this point, since the plasma atomic layer deposition apparatus 100 has characteristics such as the undesirable formation of the film not only on the substrate 1S but also over even the corners in the film-forming container including the small space, the film is undesirably formed even in the small space existing in the fixed portion of the upper electrode UE by the screw. This means that the film is undesirably formed on the upper electrode UE itself through the fixed portion by the screw even if the conductor deposition preventing member is arranged to the opposite surface of the upper electrode UE opposed to the substrate 1S. By the undesirable formation of the film on the upper electrode UE itself, a potential of occurrence of the foreign substances due to the peeling off of the film from the upper electrode UE is increased, and therefore, it is required to remove the film adhered to the upper electrode UE itself.

Here, for example, an approach to removing the film adhered to the upper electrode UE by dry etching introducing cleaning gas into the film-forming container is considered. However, in the plasma atomic layer deposition apparatus 100, while the film is formed over even the corners of the film-forming container including the small space, the dry etching using the cleaning gas removes the film only in the part where the plasma discharge is generated, and is difficult to spread the cleaning gas over the corners of the film-forming container including the small space. Particularly, the cleaning gas is difficult to spread into the small space existing at the portion fixed by the screw, and therefore, unrealistically-long cleaning time is required for removing the film formed in the small space existing at the portion fixed by the screw. Further, for example, while an aluminum oxide film ($Al_2O_3$ film) can be exemplified as the film formed by the plasma atomic layer deposition apparatus 100, it is difficult to remove this aluminum oxide film by the dry etching. Therefore, in the dry etching using the cleaning gas in the plasma atomic layer deposition apparatus 100, it is difficult to use the dry etching for the removal of the film formed in the small space existing at the fixed portion of the upper electrode UE by the screw.

Accordingly, for example, an approach to detaching the upper electrode UE itself and removing the film adhered to the upper electrode UE by the wet etching is considered. However, when the upper electrode UE is attached again after detaching the upper electrode UE and performing the wet etching, the attachment position of the upper electrode UE is different from a previous attachment position. In this case, a state of the plasma discharge between the upper electrode UE and the lower electrode BE changes. That is, in the method of detaching the upper electrode UE and performing the cleaning by the wet etching, the attachment position of the upper electrode UE itself cannot be repeated, and, as a result, the attachment position of the upper electrode UE changes, and therefore, the film-forming condition represented by the state of the plasma discharge undesirably changes. This case has a risk of change in the quality of the film formed on the substrate 1S. Further, in the method of removing the film adhered to the upper electrode UE itself by the wet etching, it is required to take out the upper electrode UE after the film-forming container is released to the air pressure, and therefore, maintenance workability is reduced.

In the above-described manner, in order to prevent the adhesion of the film to the upper electrode UE itself, it is required to not only arrange the conductive deposition preventing member on the opposite surface of the upper electrode UE opposed to the substrate 1S, but also contrive the attachment structure of the conductive deposition preventing member. That is, if the attachment structure of the conductive deposition preventing member is not contrived even if the conductive deposition preventing member is attached to the opposite surface of the upper electrode UE opposed to the substrate 1S, the adhesion of the film on the upper electrode UE itself cannot be sufficiently suppressed. Accordingly, in the plasma atomic layer deposition apparatus 100 according to the present first embodiment, the attachment structure of the conductive deposition preventing member has been contrived. A technical concept in the present first embodiment with this contrivance will be described below.

<Basic Concept in Present First Embodiment>

Figure 3:
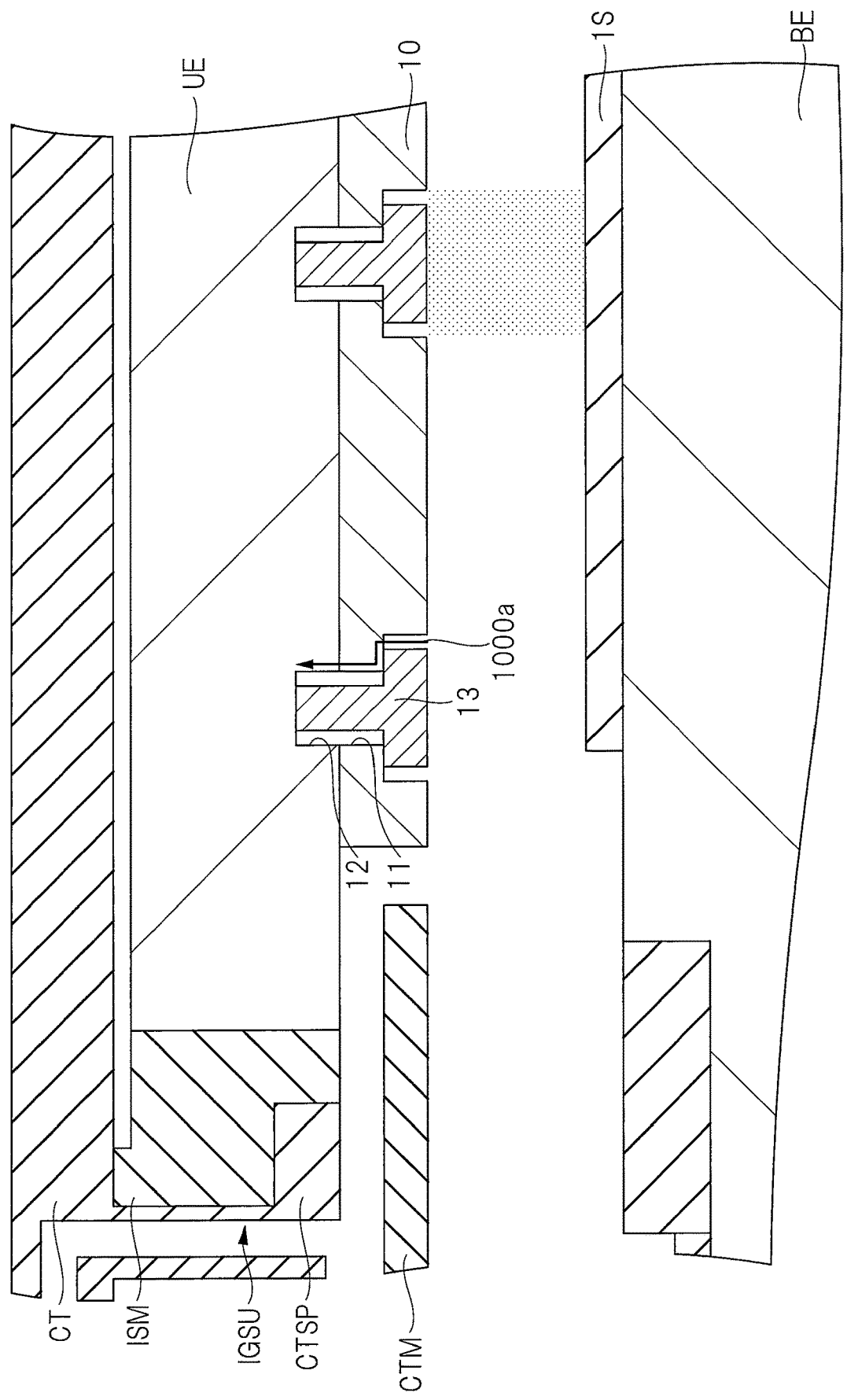
FIG. 3 is a diagram for describing necessity for contrivance of an attachment structure of a conductive deposition preventing member provided on a lower surface of an upper electrode.

FIG. 3 is a diagram for describing necessity of the contrivance for the attachment structure of the conductive deposition preventing member 10 formed on a lower surface of the upper electrode UE. As shown in FIG. 3, the conductive deposition preventing member 10 is formed on the lower surface (opposite surface) of the upper electrode UE opposed to the substrate 1S. This conductive deposition preventing member 10 is fixed by a screw 13 inserted into a through hole 11 penetrating the conductive deposition preventing member 10 and into a groove 12 formed on the lower surface of the upper electrode UE to communicate with the through hole 11.

Here, since the plasma atomic layer deposition method has the characteristics such as the undesirable formation of the film on not only the substrate 1S but also the small space, the film is undesirably formed even in the small space existing at the fixed portion of the upper electrode UE by the screw 13. That is, in a passage 1000a indicated by a thick arrow in FIG. 3, the film is undesirably formed even from the discharge space to the groove 12 formed on the upper electrode UE. Particularly, as a distance of the passage 1000a indicated by the thick arrow in FIG. 3 is shorter, it is easier to form the film also inside (in the small space of) the groove 12 formed on the upper electrode UE.

Accordingly, as shown in FIG. 3, the basic concept of the present first embodiment is to, for example, make the passage 1000a as long as possible, the passage reaching from the discharge space to the groove 12 formed on the upper electrode UE through the fixed portion by the screw 13. As described above, as the passage 1000a reaching from the discharge space to the groove 12 formed on the upper electrode UE through the fixed portion by the screw 13 is longer, the film formation on the upper electrode UE itself is more suppressed. That is, the basic concept of the present first embodiment is to make the passage reaching from the discharge space to the groove 12 formed on the upper electrode UE through the fixed portion by the screw 13 to be sufficiently longer than the distance of the passage 1000a indicated by the thick arrow in FIG. 3. And, in the plasma atomic layer deposition apparatus according to the first embodiment, in order to embody the basic concept of the present first embodiment, the attachment structure of the conductive deposition preventing member is contrived. The following is the description about a feature point of the attachment structure of the conductive deposition preventing member for embodying the basic concept of the present first embodiment.

<Features of First Embodiment>

Figure 4:
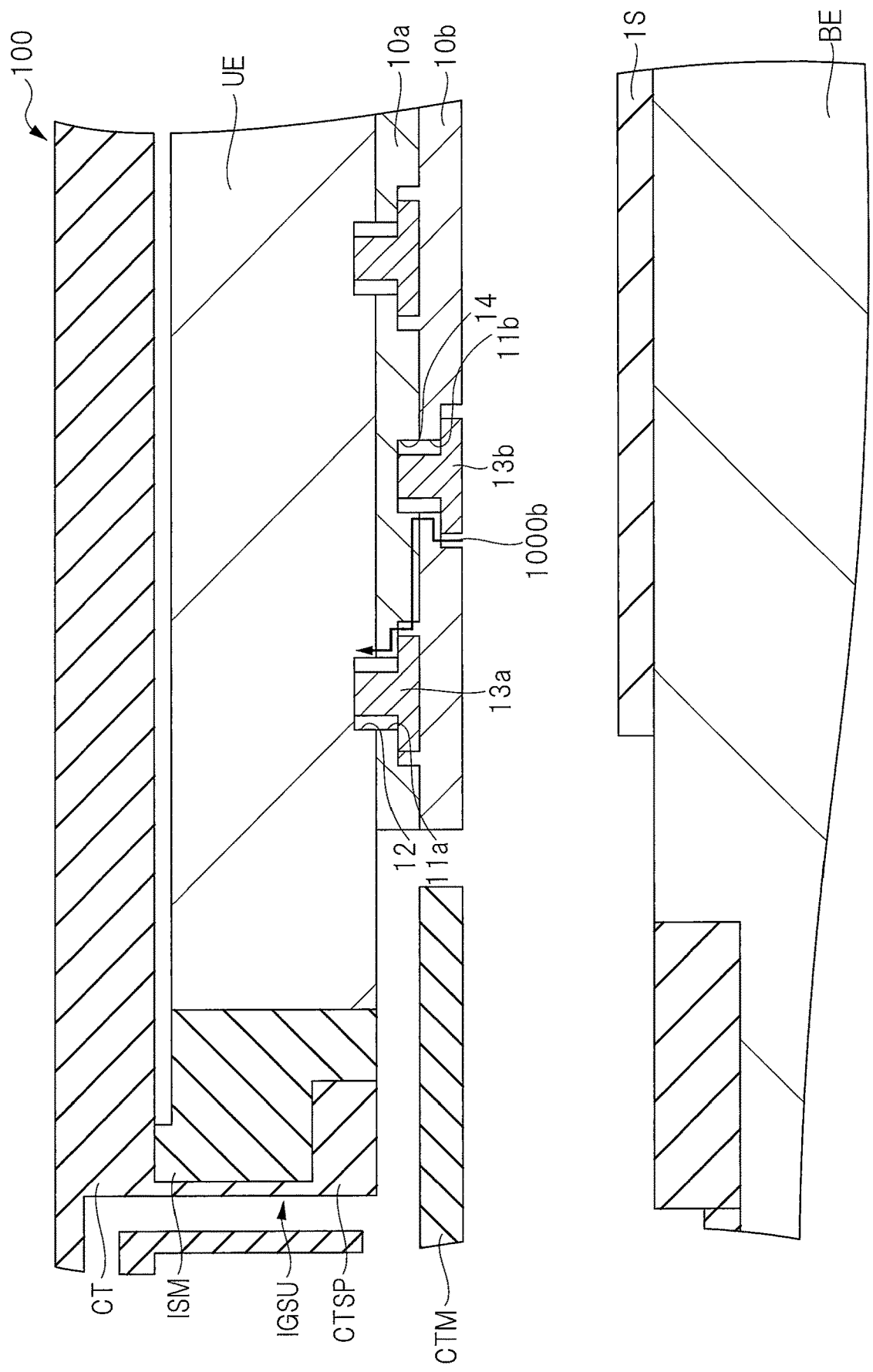
FIG. 4 is a diagram for describing a feature point according to the first embodiment.

FIG. 4 is a diagram for describing the feature point of the present first embodiment. That is, FIG. 4 is a diagram for describing the feature point of the attachment structure of the conductive deposition preventing member. As shown in FIG. 4, it is assumed that the plasma atomic layer deposition apparatus 100 according to the present first embodiment includes, for example, a lower electrode BE for holding the substrate 1S and an upper electrode UE for generating the plasma discharge in corporation with the lower electrode BE, the upper electrode UE having an opposite surface (lower surface) opposed to the lower electrode BE. In the plasma atomic layer deposition apparatus 100 according to the present first embodiment, a conductive deposition preventing member 10a is fixed to a lower surface of the upper electrode UE by a plurality of screws 13a, and a conductive deposition preventing member 10b is fixed to a lower surface of the conductive deposition preventing member 10a by a plurality of screws 13b. In this case, the feature point of the present first embodiment is that, for example, the plurality of screws 13a and the plurality of screws 13b are arranged so as not to overlap each other as shown in FIG. 4. In other words, the feature point of the present first embodiment is that, for example, the plurality of screws 13a and the plurality of screws 13b are arranged so as to be distant from each other in a plan view.

Specifically, as shown in FIG. 4, a through hole 11a is formed in the conductive deposition preventing member 10a, and a groove 12a communicating with this through hole 11a is formed on the upper electrode UE. By the insertion of each screw 13a into the through hole 11a and the groove 12, the conductive deposition preventing member 10a is attached to the lower surface of the upper electrode UE. On the other hand, a through hole 11b is formed in the conductive deposition preventing member 10b, and a groove 14 communicating with this through hole 11b is formed on the conductive deposition preventing member 10a. By the insertion of each screw 13b into the through hole 11b and the groove 14, the conductive deposition preventing member 10b is attached to the lower surface of the conductive deposition preventing member 10a. In this case, as shown in FIG. 4, the feature point of the present first embodiment is that each screw 13a fixing the conductive deposition preventing member 10a to the upper electrode UE and each screw 13b fixing the conductive deposition preventing member 10b to the conductive deposition preventing member 10a are alternately arranged. In other words, as shown in FIG. 4, the feature point of the present first embodiment is that each screw 13a fixing the conductive deposition preventing member 10a to the upper electrode UE and each screw 13b fixing the conductive deposition preventing member 10b to the conductive deposition preventing member 10a are alternately arranged so as not to overlap each other. In this manner, a passage 1000b indicated by a thick arrow in FIG. 4 is much larger than the passage 1000a indicated by the thick arrow in FIG. 3. This means that, according to the feature point of the present first embodiment, a distance of gas infiltration from the discharge space to the groove 12 formed on the upper electrode UE itself becomes long. Therefore, even in the plasma atomic layer deposition apparatus 100 having such characteristics as the undesirable formation of the film also in the small space, the adhesion of the film to the upper electrode UE itself can be effectively prevented by applying the feature point of the present first embodiment as the contrivance for the attachment structure of the conductive deposition preventing member. As a result, in the plasma atomic layer deposition apparatus 100 according to the present first embodiment, the frequency of the maintenance work of detaching the upper electrode UE to remove the film adhered to the upper electrode UE is reduced, and thus, the change in the film-forming condition due to the change in the attachment position of the upper electrode UE can be suppressed. As a result, by the application of the feature point of the present first embodiment, the change in the quality of the film formed on the substrate 1S can be suppressed. In the plasma atomic layer deposition apparatus 100 according to the present first embodiment, from these facts, it can be said that the film having the good quality can be stably formed on the substrate 1S.

Figure 5A:
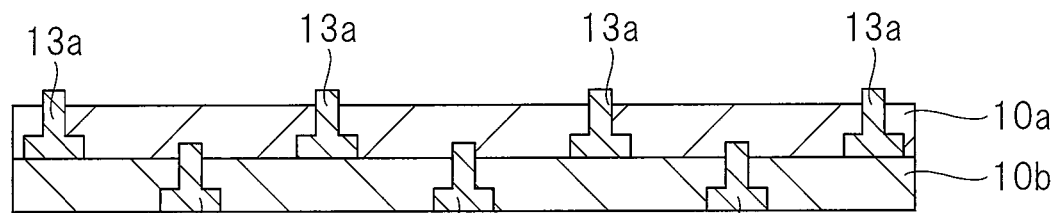
FIG. 5A is a cross-sectional view showing a first conductive deposition preventing member and a second conductive deposition preventing member.

Next, FIG. 5A is a cross-sectional view showing the conductive deposition preventing member 10a and the conductive deposition preventing member 10b. In FIG. 5A, the conductive deposition preventing member 10a is fixed to an upper electrode not shown, by the plurality of screws 13a. Meanwhile, the conductive deposition preventing member 10b is fixed to the conductive deposition preventing member 10a by the plurality of screws 13b.

Figure 5B:
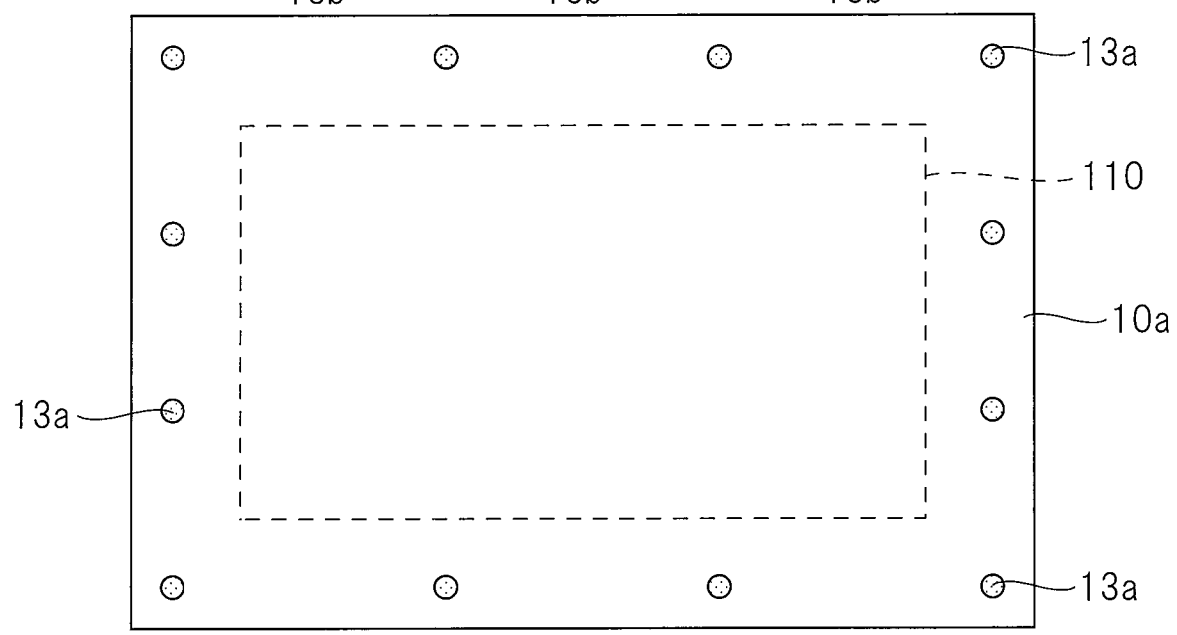
FIG. 5B is a plan view of the first conductive deposition preventing member shown in FIG. 5A as viewed from above.

Here, FIG. 5B is a plan view of the conductive deposition preventing member 10a shown in FIG. 5A as viewed from above. In FIG. 5B, a plan shape of the conductive deposition preventing member 10a is rectangular, and the plurality of screws 13a are arranged in an outer edge region of the conductive deposition preventing member 10a. And, in FIG. 5B, a region 110 encircled with a broken line indicates, for example, a region overlapping the substrate 1S shown in FIG. 1 in plane. Therefore, the plurality of screws 13a arranged in the outer edge region of the conductive deposition preventing member 10a do not overlap the substrate 1S shown in FIG. 1 in plane.

Figure 5C:
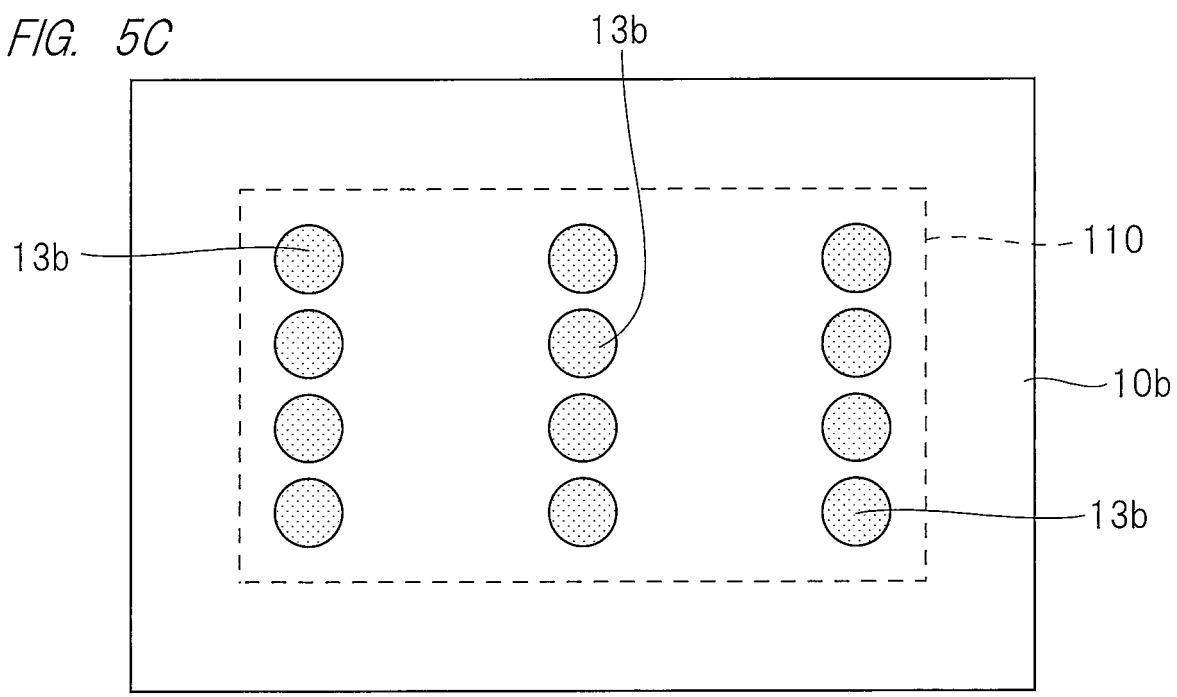
FIG. 5C is a plan view of the second conductive deposition preventing member shown in FIG. 5A as viewed from below.

Next, FIG. 5C is a plan view of the conductive deposition preventing member 10b shown in FIG. 5A as viewed from below. In FIG. 5C, a plan shape of the conductive deposition preventing member 10b is rectangular. And, in FIG. 5C, for example, a region 110 overlapping the substrate 1S shown in FIG. 1 in plane is illustrated with a broken line. In this case, the plurality of screws 13b are arranged inside the region 110 overlapping the substrate 1S shown in FIG. 1 in plane.

However, for example, when the screw 13 for fixing the conductive deposition preventing member 10 to the upper electrode UE exists above the substrate 1S arranged on the lower electrode BE as shown in FIG. 3, there is a concern that the film formed in the small space existing at the fixed portion by this screw 13 peels off and deposits on the substrate 1S. In this case, the peeled film becomes foreign substances adhered to the substrate 1S. As a result, there is a risk of adverse influence on the quality of the film formed on the substrate 1S. In other words, when the fixed portion by the screw 13 exists at the position overlapping the substrate 1S in plane, there is a high risk of the adverse influence on the quality of the film formed on the substrate 1S because of occurrence of the foreign substances due to the peeling off of the film adhered to the fixed portion by the screw 13. Regarding this point, as shown in FIG. 5C, the plurality of screws 13b for fixing the conductive deposition preventing member 10b are also arranged in the region overlapping the substrate is in plane. As similar to the configuration of FIG. 3, these facts cause the risk of the adverse influence on the quality of the film formed on the substrate 1S because of occurrence of the foreign substances due to the peeling off of the film adhered to the fixed portions by the screws 13b. Accordingly, in the following modification example, contrivance for this point is performed.

<Modification Example>

Figure 6A:
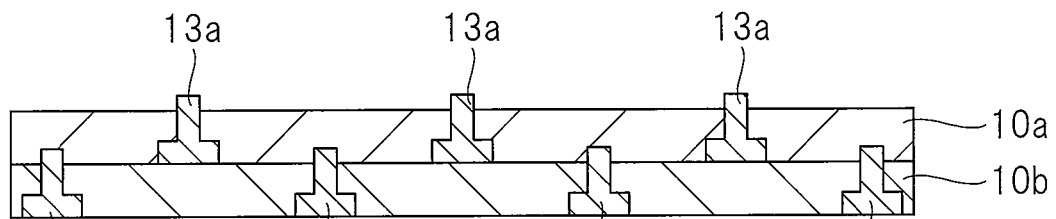
FIG. 6A is a cross-sectional view showing a first conductive deposition preventing member and a second conductive deposition preventing member.

Next, the modification example according to the present first embodiment will be described. FIG. 6A is a cross-sectional view showing the conductive deposition preventing member 10a and the conductive deposition preventing member 10b. In FIG. 6A, the conductive deposition preventing member 10a is fixed to an upper electrode not shown, by the plurality of screws 13a. Meanwhile, the conductive deposition preventing member 10b is fixed to the conductive deposition preventing member 10a by the plurality of screws 13b.

Figure 6B:
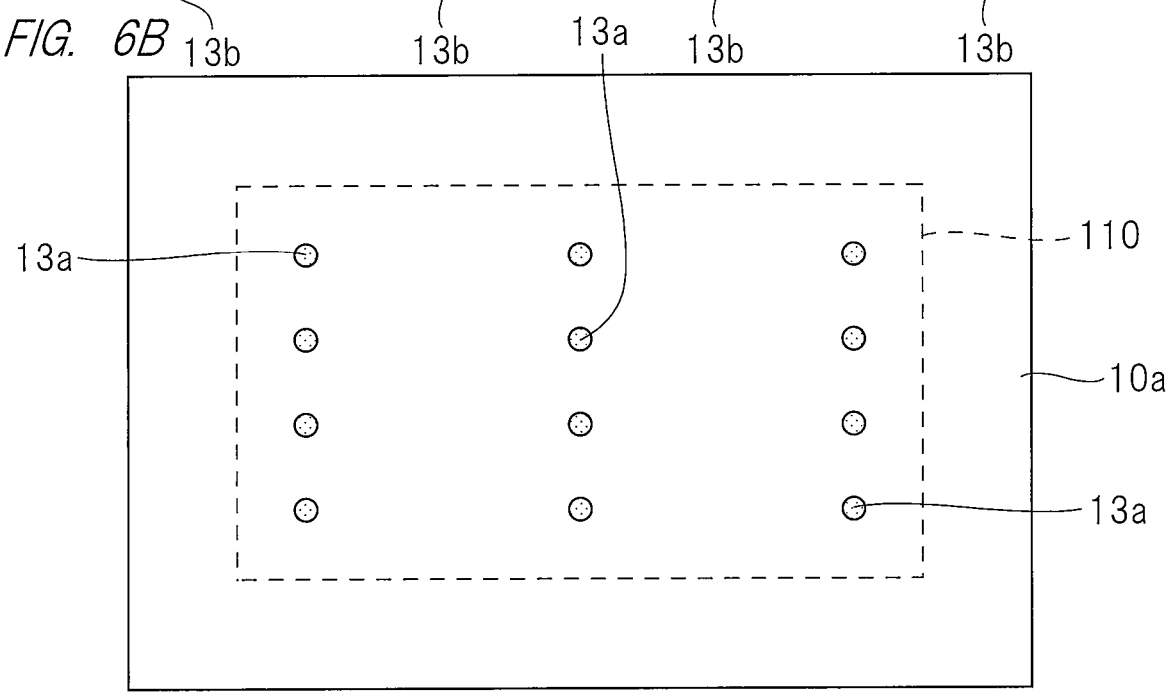
FIG. 6B is a plan view of the first conductive deposition preventing member shown in FIG. 5A as viewed from above.

FIG. 6B is a plan view of the conductive deposition preventing member 10a shown in FIG. 6A as viewed from above. In FIG. 6B, a plan shape of the conductive deposition preventing member 10a is rectangular, and the plurality of screws 13a are arranged in a region 110 overlapping the substrate 1S (see FIG. 1) in plane. That is, in the present modification example, the plurality of screws 13a for fixing the conductive deposition preventing member 10a to the upper electrode are provided in the region 110 overlapping the substrate 1S in plane.

Figure 6C:
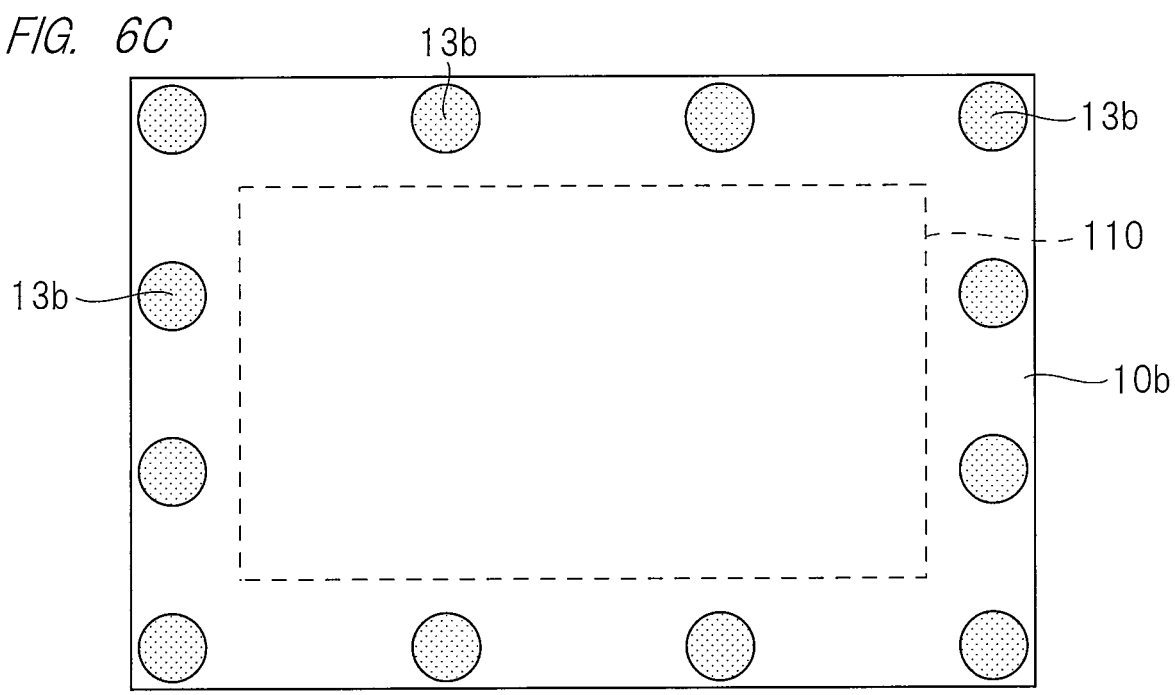
FIG. 6C is a plan view of the second conductive deposition preventing member shown in FIG. 5A as viewed from below.

Subsequently, FIG. 6C is a plan view of the conductive deposition preventing member 10b shown in FIG. 6A as viewed from below. In FIG. 6C, a plan shape of the conductive deposition preventing member 10b is rectangular. And, in FIG. 6C, for example, the region 110 overlapping the substrate 1S in plane is illustrated with a broken line. In this case, the plurality of screws 13b are arranged in a region not overlapping the substrate 1S in plane. Thus, according to the present modification example, the plurality of screws 13b are arranged in the region not overlapping the region 110 in plane, and therefore, the risk of the adverse influence on the quality of the film formed on the substrate 1S because of occurrence of the foreign substances due to the peeling off of the film adhered to the fixed portions by the screws 13b can be reduced. In other words, the plurality of screws 13b are arranged at positions that are distant from the substrate 1S in a plane view, and therefore, the risk of the adverse influence on the quality of the film formed on the substrate 1S because of occurrence of the foreign substances due to the peeling off of the film adhered to the fixed portions by the screws 13b can be reduced. That is, when the plurality of screws 13b are arranged so as to overlap the region 110 in plane, a possibility of the adhesion of the foreign substances due to the peeled film on the substrate 1S is high. On the other hand, when the plurality of screws 13b are arranged so as not to overlap the region 110 in plane, the possibility of the adhesion of the foreign substances due to the peeled film on the substrate 1S is low. As a result, according to the present modification example, a potential of the occurrence of the foreign substances due to the peeling off of the film adhered to the fixed portions by the screws 13b can be reduced.

<Atomic Layer Deposition Method>

Figure 7:
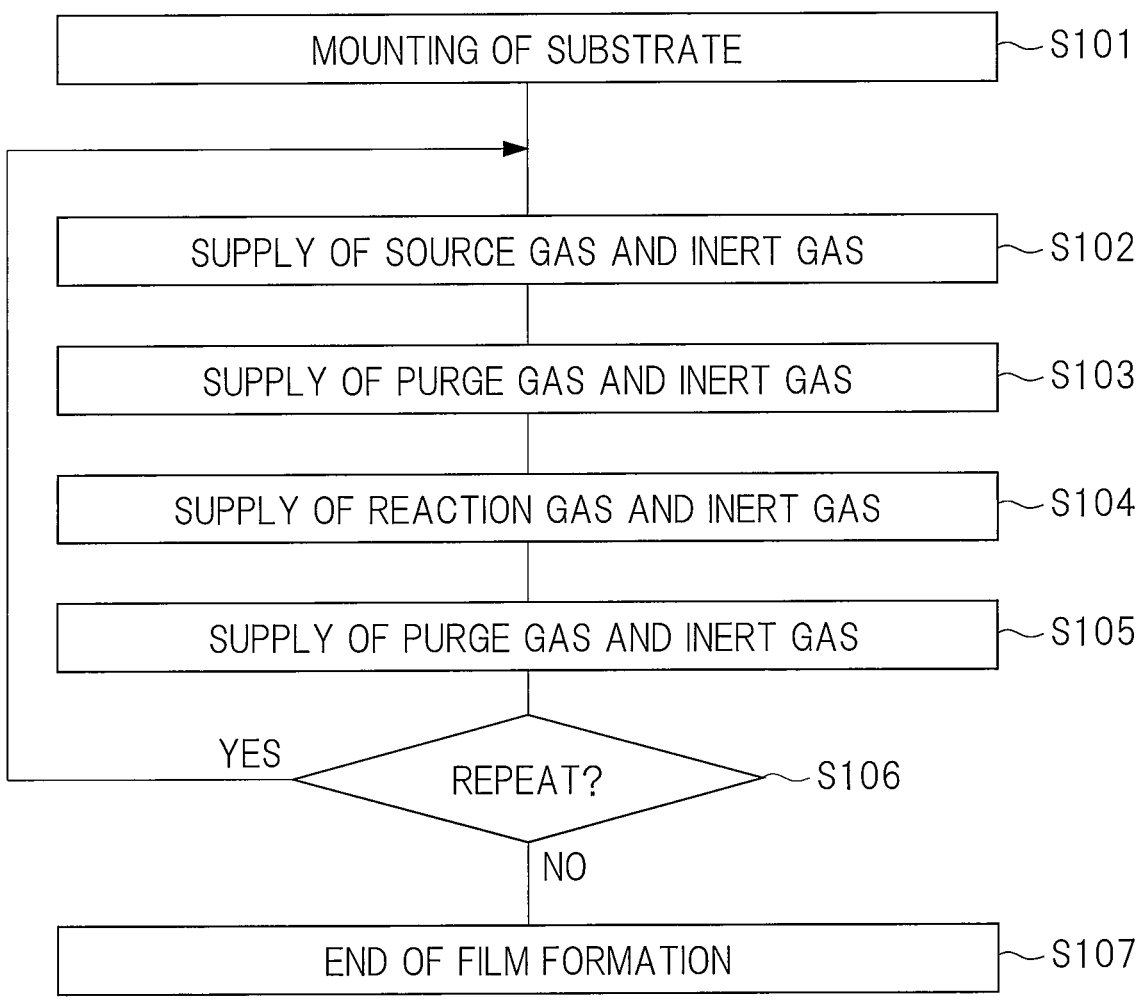
FIG. 7 is a flowchart describing an atomic layer deposition method according to the first embodiment.

Next, an atomic layer deposition method according to the present first embodiment will be described. FIG. 7 is a flowchart for describing the atomic layer deposition method according to the present first embodiment, and each of FIGS. 8A to 8E is a diagram schematically showing a step of forming the film on the substrate.

Figure 8A:
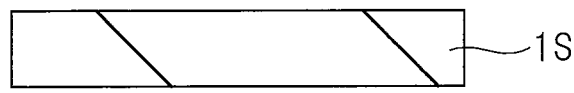
FIG. 8A is a diagram schematically showing a step of forming a film on a substrate.
Figure 8B:
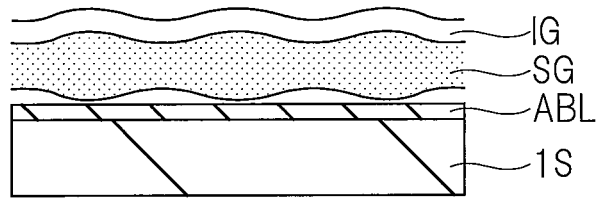
FIG. 8B is a diagram schematically showing a step of forming the film on the substrate.

First, after the substrate 1S shown in FIG. 8A is prepared, the substrate 1S is mounted on the lower electrode BE (stage) of the plasma atomic layer deposition apparatus 100 shown in FIG. 1 (S101 in FIG. 7). Subsequently, the source gas is supplied from a gas supply unit GSU of the plasma atomic layer deposition apparatus 100 shown in FIG. 1 into the film-forming container, and the inert gas is supplied from an inert-gas supply unit IGSU into the film-forming container (S102 in FIG. 7). At this time, the source gas is supplied into the film-forming container for, for example, 0.1 seconds. In this manner, as shown in FIG. 8B, the inert gas IG and the source gas SG are supplied into the film-forming container, and the source gas SG is adsorbed onto the substrate 1S to form an adsorption layer ABL.

Figure 8C:
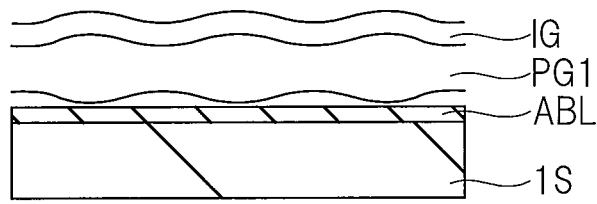
FIG. 8C is a diagram schematically showing a step of forming the film on the substrate.

Subsequently, after the supply of the source gas stops, a purge gas is supplied from the gas supply unit GSU, and the inert gas is supplied from the inert-gas supply unit IGSU into the film-forming container (S103 in FIG. 7). In this manner, while the purge gas is supplied into the film-forming container, the source gas is exhausted from an exhaust unit to outside of the film-forming container. The purge gas is supplied into the film-forming container for, for example, 0.1 seconds. And, the exhaust unit exhausts the source gas and the purge gas in the film-forming container for, for example, 2 seconds. In this manner, as shown in FIG. 8C, the inert gas IG and the purge gas PG1 are supplied into the film-forming container, and the source gas SG not absorbed on the substrate 1S is purged from the film-forming container.

Figure 8D:
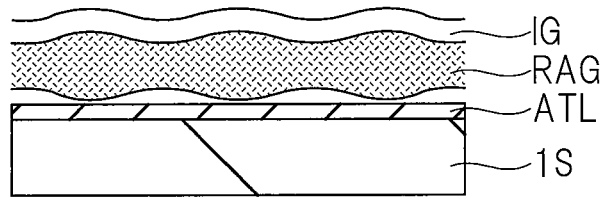
FIG. 8D is a diagram schematically showing a step of forming the film on the substrate.

Next, a reaction gas is supplied from the gas supply unit GSU, and the inert gas is supplied from the inert-gas supply unit IGSU into the film-forming container (S104 in FIG. 7). In this manner, the reaction gas is supplied into the film-forming container. The reaction gas is supplied into the film-forming container for, for example, 1 second. In this step of supplying the reaction gas, the plasma discharge is generated by applying a discharge voltage to a portion between the upper electrode UE and the lower electrode BE shown in FIG. 1. As a result, radicals (active species) are generated in the reaction gas. In this manner, as shown in FIG. 8D, the inert gas IG and the reaction gas RAG are supplied into the film-forming container, and the absorption layer absorbed on the substrate 1S chemically reacts with the reaction gas RAG, so that a thin layer made of an atomic layer ATL is formed.

Figure 8E:
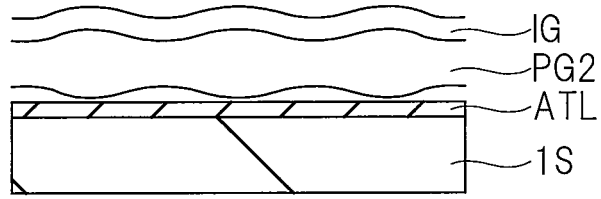
FIG. 8E is a diagram schematically showing a step of forming the film on the substrate.

Subsequently, after the supply of the reaction gas stops, the purge gas is supplied from the gas supply unit GSU, and the inert gas is supplied from the inert-gas supply unit IGSU into the film-forming container (S105 in FIG. 7). In this manner, while the purge gas is supplied into the film-forming container, the reaction gas is exhausted from the exhaust unit to the outside of the film-forming container. The reaction gas is supplied into the film-forming container for, for example, 0.1 seconds. And, the exhaust unit exhausts the source gas and the purge gas in the film-forming container for, for example, 2 seconds. In this manner, as shown in FIG. 8E, the inert gas IG and a purge gas PG2 are supplied into the film-forming container, and an excessive part of the reaction gas RAG that is not used for the reaction is purged from the film-forming container.

In the above-described manner, a thin layer made of a single atomic layer ATL is formed on the substrate 1S. Then, by repeating the above-described steps (S102 to S105 in FIG. 7) a predetermined number of times (S106 in FIG. 7), a thin layer made of a plurality of the atomic layers ATL is formed. In this manner, the film-forming process ends (S107 in FIG. 7).

<Advantage on Manufacturing Method According to Embodiment>

In the atomic layer deposition method according to the present first embodiment, the film is formed on the substrate by using the plasma. In this case, the atomic layer deposition method according to the present first embodiment includes (a) a step of supplying the source gas into the film-forming container in which the substrate is placed, (b) a step of supplying a first purge gas into the film-forming container after the step (a), (c) a step of supplying the reaction gas into the film-forming container after the step (b), and (d) a step of supplying a second purge gas into the film-forming container after the step (c). At this time, in the present embodiment, the inert gas is further supplied into the film-forming container during the steps (a), (b), (c) and (d).

This manner can obtain an advantage that makes the unnecessary film difficult to be formed in the film-forming container, the unnecessary film becoming a generation source of the foreign substances. Particularly in the plasma atomic layer deposition apparatus shown in FIG. 1 formed by embodying the atomic layer deposition method according to the present first embodiment, while the source gas, the purge gas and the reaction gas are supplied from the gas supply unit GSU, the inert gas is supplied from the inert-gas supply unit IGSU different from the gas supply unit GSU. In this manner, regardless of the arrangement position of the gas supply unit GSU, the inert gas can be efficiently supplied to a portion on which it is desirable to prevent the adhesion of the unnecessary film (a portion largely affecting on the film quality of the film formed on the substrate 1S). Therefore, according to the present embodiment, the film quality of the film formed on the substrate 1S can be improved.

Further, in the atomic layer deposition method according to the present first embodiment, pressure change in the film-forming container during the steps (a), (b), (c) and (d) can be smaller than pressure change in the film-forming container in a case of no supply of the inert gas. This is because differences among a flow rate of the source gas, a flow rate of the purge gas and a flow rate of the reaction gas are moderated by a flow rate of the inert gas supplied into the film-forming container during the steps (a), (b), (c) and (d). That is, in the present first embodiment, the flow rate of the inert gas supplied into the film-forming container during the steps (a), (b), (c) and (d) is adjusted so that a flow rate of combination of the source gas and the inert gas, a flow rate of combination of the purge gas and the inert gas and a flow rate of combination of the reaction gas and the inert gas are almost equal to one another. As a result, in the atomic layer deposition method according to the present first embodiment, the pressure change in the film-forming container during the steps (a), (b), (c) and (d) can be smaller than the pressure change in the film-forming container in the case of no supply of the inert gas. In this manner, the occurrence of the foreign substances due to the pressure change in the film-forming container can be suppressed. This is because, since the film is adhered to an adhesion-unwanted portion in the film-forming container in the atomic layer deposition method to cause the foreign substances due to the peeling off of a part of the adhered film, the film is oscillated by the pressure change when the pressure change in the film-forming container is large so that the peeling off of the film is easily advanced. In other words, in the present first embodiment, the pressure change in the film-forming container can be reduced, and, as a result, the advance of the peeling off of the film becoming the cause of the occurrence of the foreign substances can be suppressed. Therefore, in the atomic layer deposition method according to the present first embodiment, the occurrence of the foreign substances can be suppressed, and therefore, the reduction in the film quality of the film formed on the substrate because of the occurrence of the foreign substances can be suppressed.

<Application Example of Atomic Layer Deposition Method>

In the atomic layer deposition method according to the present first embodiment, an aluminum oxide film can be formed by, for example, using TMA as the source material, oxygen gas as the reaction gas, and nitrogen gas as the purge gas. Particularly, the aluminum oxide film formed on the substrate can be formed as a film forming a part of a protection film protecting a luminescence layer of an organic EL element.

The film formed on the substrate can be prepared as not only the aluminum oxide film but also various types of films represented by a silicon oxide film. For example, the film formed on the substrate by the atomic layer deposition method according to the present embodiment can be formed also as a film forming a gate insulating film of a field effect transistor (semiconductor element).

Second Embodiment

<Study on Improvement>

Figure 9:
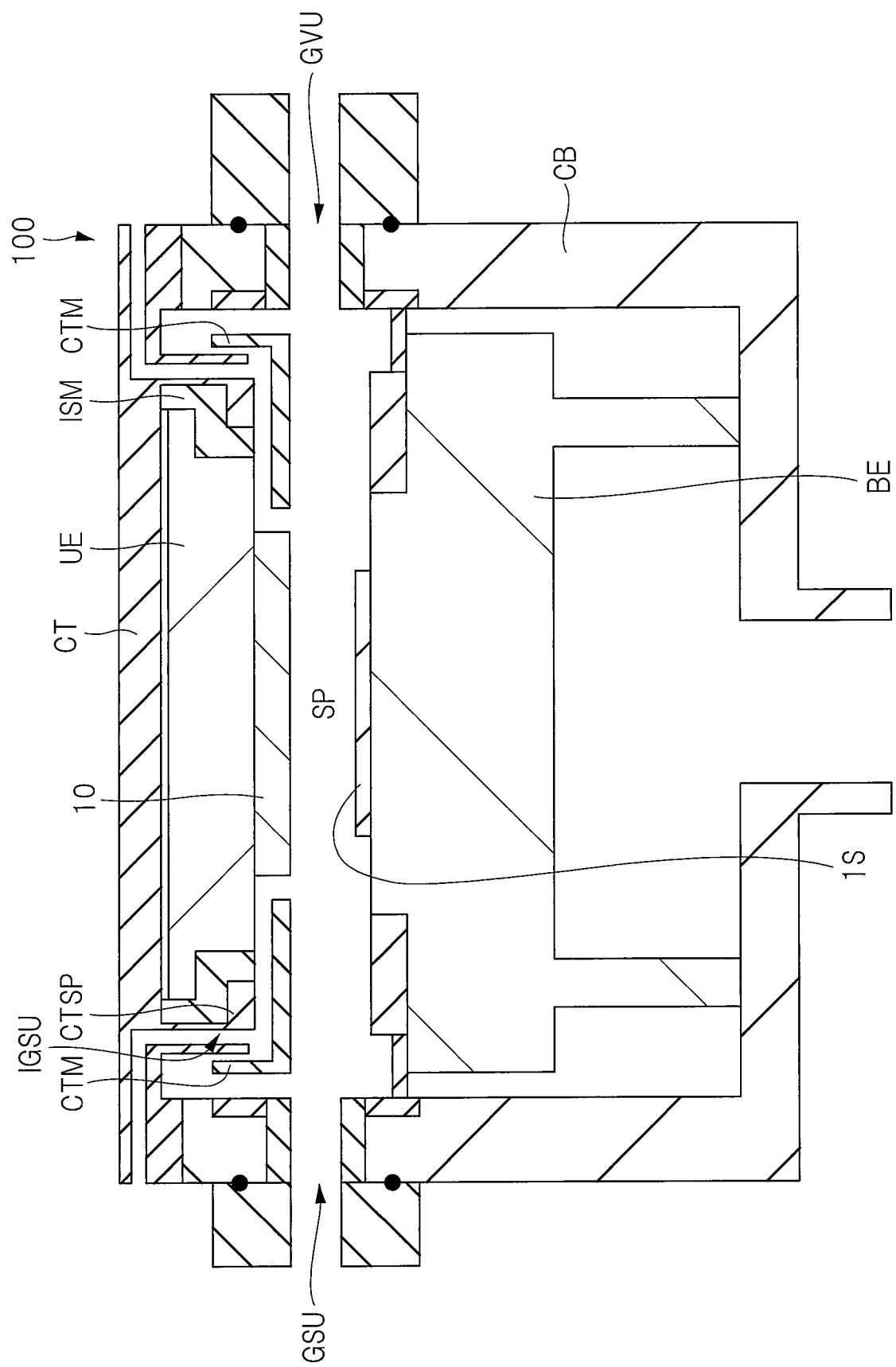
FIG. 9 is a diagram showing a schematic entire configuration of a plasma atomic layer deposition apparatus according to a second embodiment.

FIG. 9 is a diagram showing a schematic overall configuration of a plasma atomic layer deposition apparatus 100 according to the present second embodiment. In the plasma atomic layer deposition apparatus 100 according to the present second embodiment in FIG. 9, a single conductive deposition preventing member 10 is provided on the lower surface of the upper electrode UE opposed to the substrate 1S arranged on the lower electrode BE as different from the configuration in which the conductive deposition preventing member 10a and the conductive deposition preventing member 10b that are different components from each other are provided on the lower surface of the upper electrode UE as described in the first embodiment.

Figure 10:
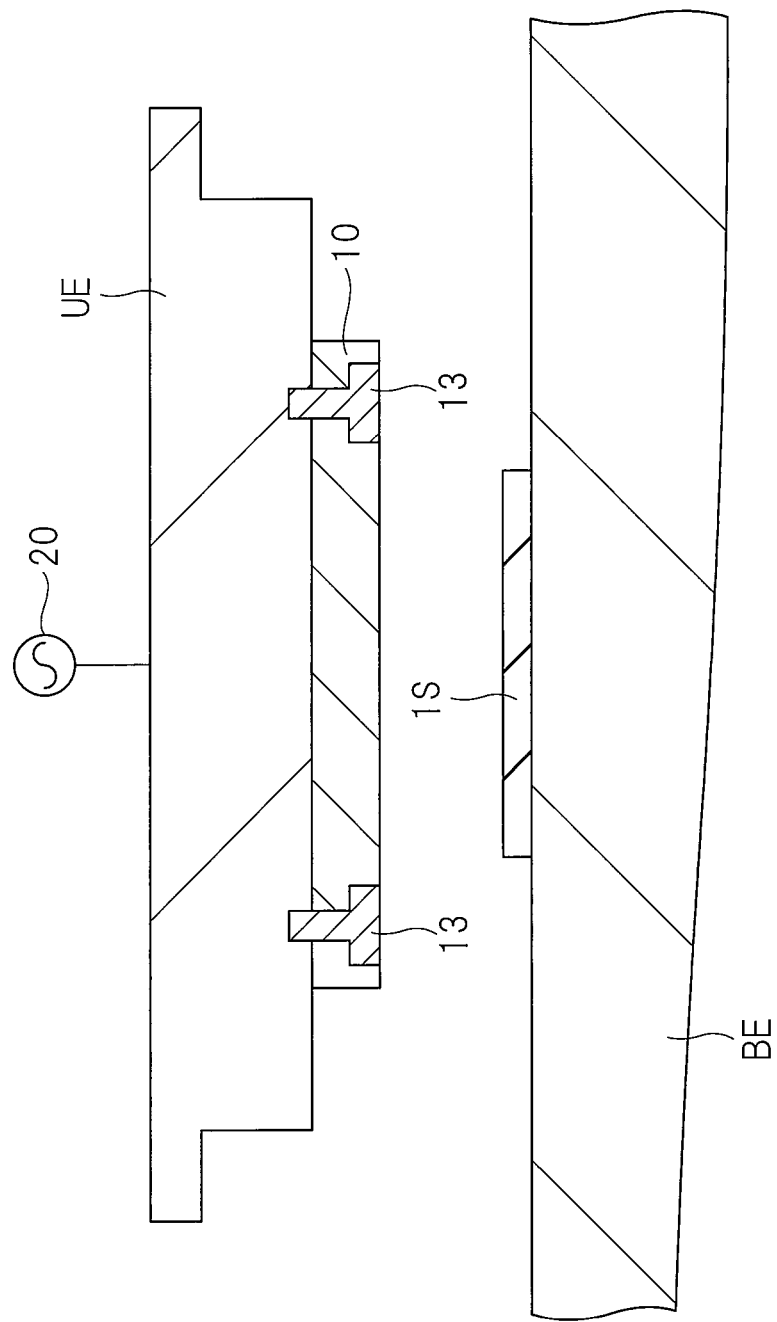
FIG. 10 is a diagram schematically showing an attachment structure in which a conductive deposition preventing member is fixed to an upper electrode electrically connected to a high-frequency power supply.

FIG. 10 is a diagram schematically showing an attachment structure that fixes the conductive deposition preventing member 10 to the upper electrode UE electrically connected to a high-frequency power source 20. As shown in FIG. 10, the conductive deposition preventing member 10 is attached to the upper electrode UE by using the screws 13. At this time, in the present second embodiment, the screws 13 are provided at positions not overlapping the substrate 1S in plane. In other words, in the present second embodiment, each of the plurality of screws 13 is arranged at a position that is distant from the substrate 1S in a plan view. That is, each of the plurality of screws 13 is provided in an outer edge region of the conductive deposition preventing member 10 not overlapping the substrate 1S in plane. In this manner, even if the film formed in the small space existing at the fixed portions by the screws 13 peels off so that the foreign substances are caused from the peeled film, the potential which may cause the adsorption of the foreign substances onto the substrate 1S can be reduced since the fixed portions themselves by the screws 13 exist at the positions that are distant from an upper portion of the substrate 1S. That is, in the present second embodiment, the adverse influence on the quality of the film formed on the substrate 1S due to the foreign substances made from the peeled film can be suppressed by such contrivance for the attachment structure of the conductive deposition preventing member 10 as providing the screws 13 at the positions not overlapping the substrate 1S in plane.

However, in recent years, from a viewpoint of reduction in a manufacturing cost by increasing the number of products taken from the substrate 1S, increase in a plan size of the substrate 1S has been promoted. In the plasma atomic layer deposition apparatus supporting such a large-size substrate 1S, the present inventors have found that a new margin for the improvement is caused by applying such contrivance for the attachment structure of the conductive deposition preventing member 10 as providing the screws 13 at the positions not overlapping the substrate 1S in plane.

Figure 11:
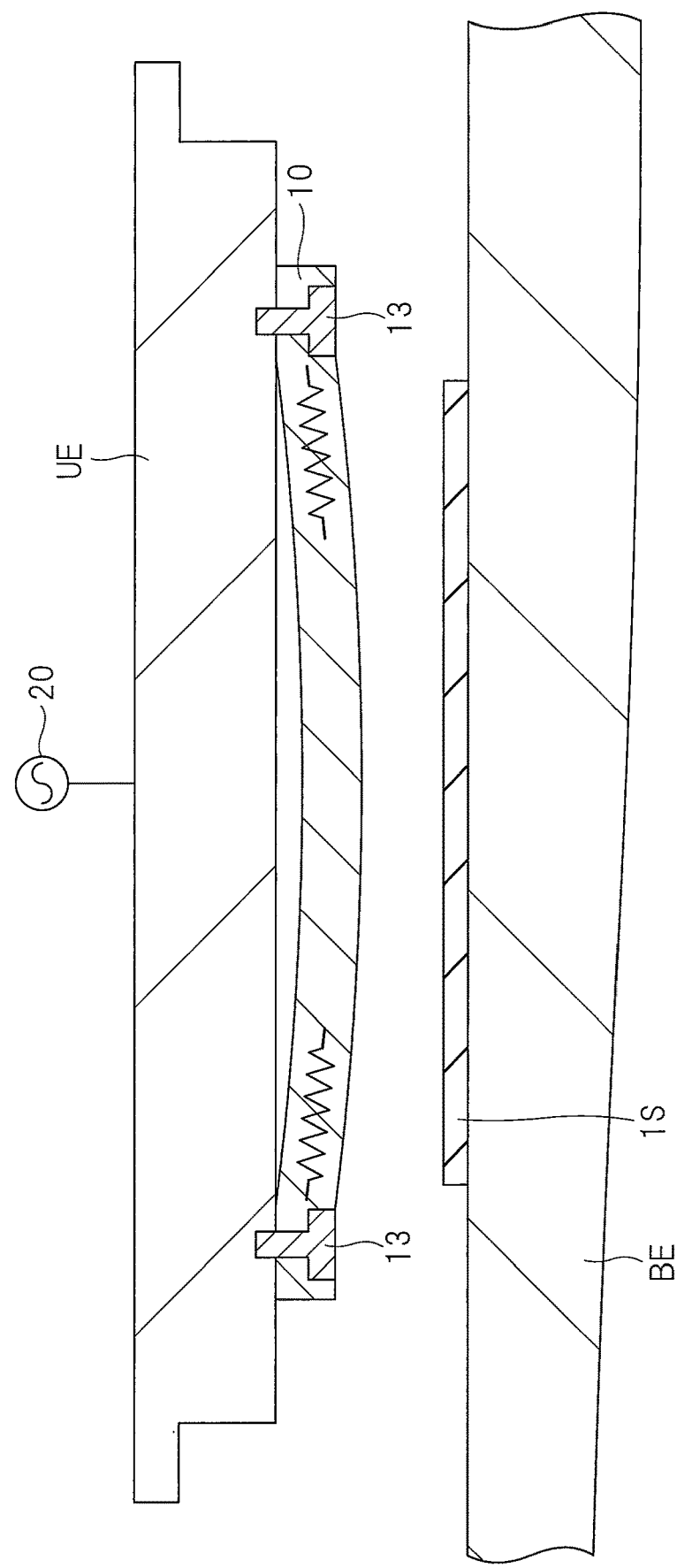
FIG. 11 is a diagram for describing an improvement margin found out by the present inventors.

This point will be described below. FIG. 11 is a diagram for describing the margin for the improvement that has been found out by the present inventors. On the lower electrode BE in FIG. 11, the substrate 1S whose plane dimension is, for example, G2 size (plane dimension is 370 mm×470 mm) is mounted. The upper electrode UE electrically connected to the high-frequency power source 20 is arranged above the substrate 1S, which is mounted on the lower electrode BE, through the discharge space, and the conductive deposition preventing member 10 is attached to the lower surface of this upper electrode UE. A plane dimension of this conductive deposition preventing member 10 is larger than the dimension of "370 mm×470 mm", and a thickness dimension of the conductive deposition preventing member 10 is equal to or smaller than 10 mm. Therefore, in a plan view, the substrate 1S is included in the conductive deposition preventing member 10. In this case, the conductive deposition preventing member 10 is fixed to the upper electrode UE by using the plurality of screws 13 provided at the positions not overlapping the substrate 1S in plane.

In the case of application of such a contrivance for the attachment structure of the conductive deposition preventing member 10 as providing the screws 13 at the positions not overlapping the substrate 1S in plane, the plane size of the conductive deposition preventing member 10 is necessarily larger than the plane size of the substrate 1S. Further, in the case of application of such a contrivance for the attachment structure of the conductive deposition preventing member 10 as providing the screws 13 at the positions not overlapping the substrate 1S in plane, a load applied to each screw 13 becomes large, and therefore, it is required to decrease a weight of the conductive deposition preventing member 10 in order to reduce the load applied to each screw 13. Therefore, in order to increase the plane size of the conductive deposition preventing member 10 to be larger than the plane size of the substrate 1S whose size is the G2 size and decrease the weight of the conductive deposition preventing member 10, it is required to decrease a thickness dimension of the conductive deposition preventing member 10. Specifically, the thickness dimension of the conductive deposition preventing member 10 is, for example, equal to or smaller than 10 mm. From these facts, when such a contrivance for the attachment structure of the conductive deposition preventing member 10 as providing the screws 13 at the positions not overlapping the substrate 1S in plane is applied to the plasma atomic layer deposition apparatus supporting the large-size substrate 1S, the plane size of the conductive deposition preventing member 10 is configured to be larger than that of the large-size substrate 1S, and the thickness of the conductive deposition preventing member 10 is configured to be as small as possible. As a result, as shown in FIG. 11, when such a contrivance for the attachment structure of the conductive deposition preventing member 10 as providing the screws 13 at the positions not overlapping the substrate 1S in plane is applied to the plasma atomic layer deposition apparatus supporting the large-size substrate 1S, distortion tends to occur in the conductive deposition preventing member 10. That is, the distortion of the conductive deposition preventing member 10 tends to be remarkable when the plane size of the conductive deposition preventing member 10 is larger than the plane size of the substrate 1S whose size is the G2 size. Further, the distortion of the conductive deposition preventing member 10 tends to be particularly remarkable when the plane size of the conductive deposition preventing member 10 is larger than a plane size of a substrate 1S whose size is a G4 size (680 mm×880 mm).

When the distortion occurs in the conductive deposition preventing member 10 as described above, electrical contact between the upper electrode UE and the conductive deposition preventing member 10 becomes instable as shown in FIG. 11. That is, as shown in FIG. 11, as a result of the occurrence of the distortion in the conductive deposition preventing member 10, a space occurs between the upper electrode UE and the conductive deposition preventing member 10. This means that, for example, a potential difference due to an internal resistance of the conductive deposition preventing member 10 itself is caused between the fixed portions by the screws (that is, the outer edge region of the conductive deposition preventing member 10) securely being in contact with the upper electrode UE and a center region of the conductive deposition preventing member 10 having the space between the conductive deposition preventing member 10 itself and the upper electrode UE due to the distortion of the conductive deposition preventing member 10. As a result, by the occurrence of the distortion of the conductive deposition preventing member 10, unexpected discharge is caused, through the space, in a portion between the upper electrode UE electrically connected to the high-frequency power source 20 and the center region of the conductive deposition preventing member 10 having a potential different from that of the upper electrode UE. By such an unexpected discharge, the plasma discharge in the discharge space sandwiched between the conductive deposition preventing member 10 and the substrate 1S becomes defective, and therefore, the formation of the film on the substrate 1S is adversely influenced. That is, when such a contrivance for the attachment structure of the conductive deposition preventing member 10 as providing the screws 13 at the positions not overlapping the substrate 1S in plane is applied to the plasma atomic layer deposition apparatus supporting the large-size substrate 1S, the unexpected discharge between the upper electrode UE and the conductive deposition preventing member 10 is introduced by the distortion of the conductive deposition preventing member 10, and therefore, the formation of the film on the substrate 1S is adversely influenced.

Accordingly, in the present second embodiment, on the premise that such a contrivance for the attachment structure of the conductive deposition preventing member 10 as providing the screws 13 at the positions not overlapping the substrate 1S in plane is applied to the plasma atomic layer deposition apparatus supporting the large-size substrate 1S, a contrivance for suppressing the unexpected discharge due to the distortion of the conductive deposition preventing member 10 has been made. A technical concept on which this contrivance has been made in the present second embodiment will be described below.

<Basic Concept in Second Embodiment>

A basic concept in the present second embodiment is a concept for suppressing the occurrence of the potential difference inside the conductive deposition preventing member while applying a premise configuration that is such a contrivance for the attachment structure of the conductive deposition preventing member 10 as providing the screws 13 at the positions not overlapping the substrate 1S in plane. Specifically, the basic concept in the present second embodiment is a concept for suppressing the potential difference inside the conductive deposition preventing member due to the distortion of the conductive deposition preventing member while accepting the occurrence of the distortion of the conductive deposition preventing member becoming remarkable by the application of the above-described promise configuration. Particularly, the basic concept in the present second embodiment is a concept for suppressing the potential difference inside the conductive deposition preventing member by improving uniformity of electrical contact between the distorted conductive deposition preventing member and the upper electrode. A feature point of the present second embodiment embodying the basic concept in the present second embodiment such as the improvement of the uniformity of the electrical contact between the distorted conductive deposition preventing member and the upper electrode will be described below with reference to the drawings.

<Feature Point of Second Embodiment>

Figure 12:
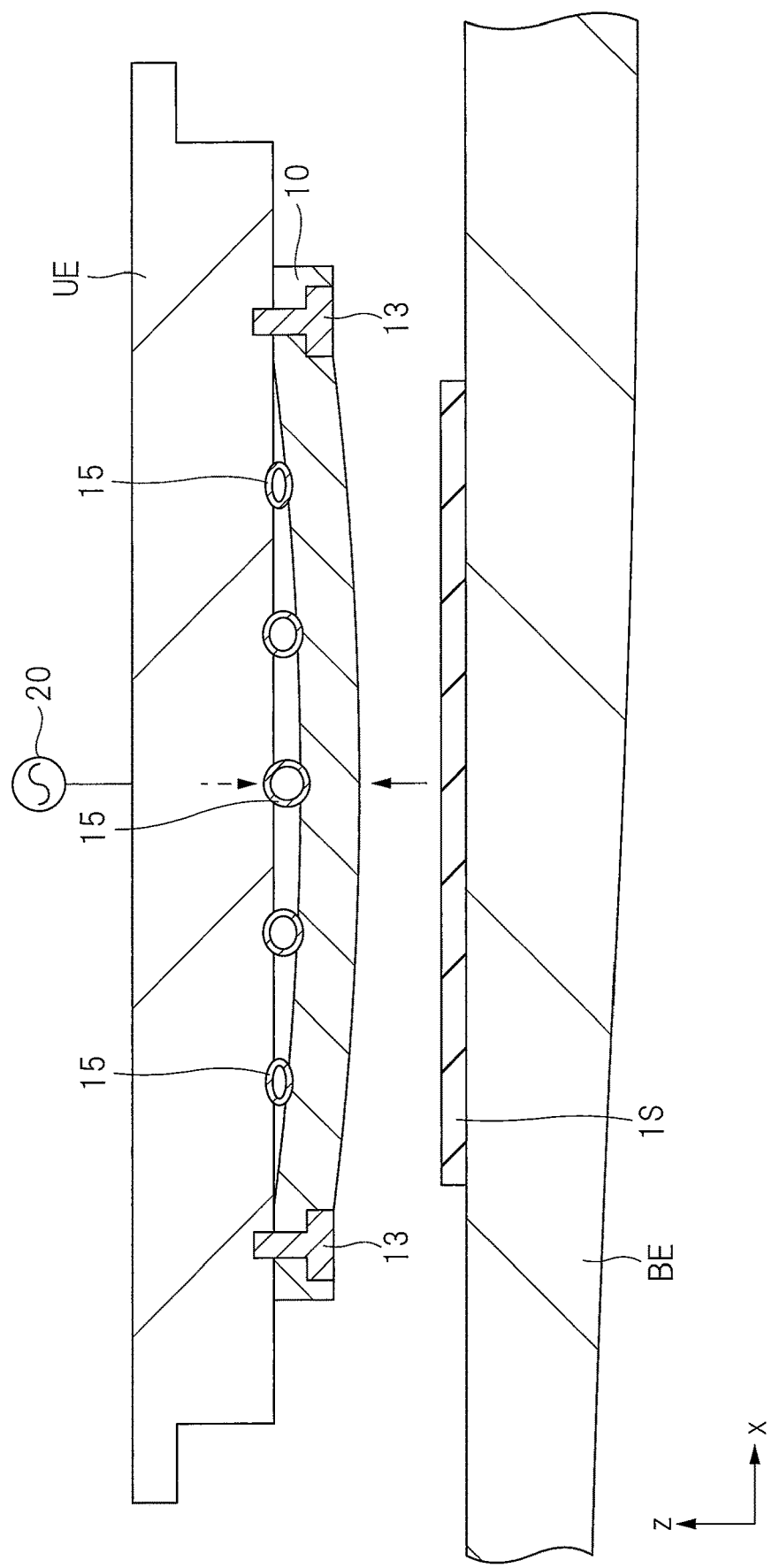
FIG. 12 is a diagram describing a feature point according to the second embodiment.

The feature point of the present second embodiment is that, for example, a conductive member 15 having a stretch property in the thickness direction (z direction) of the upper electrode UE is arranged between the upper electrode UE and the conductive deposition preventing member 10 fixed to the upper electrode UE by the screws 13 arranged at the positions not overlapping the substrate is in plane as shown in FIG. 12. In this manner, even if the distortion is caused in the conductive deposition preventing member 10 as shown in FIG. 12, the uniformity of the electrical contact between the conductive deposition preventing member 10 and the upper electrode UE can be improved. That is, as shown in FIG. 12, the conductive member 15 arranged so as to be sandwiched between the upper electrode UE and the conductive deposition preventing member 10 has the stretch property in the thickness direction of the upper electrode UE. Therefore, even if a space is caused, the space having a size continuously changing in the z direction from an end portion of the conductive deposition preventing member 10 toward a center portion of the same due to the distortion of the conductive deposition preventing member 10, the conductive member 15 expands and contracts in response to the size of this space in the z direction. Therefore, according to the feature point of the present second embodiment, the uniformity of the electrical contact between the conductive deposition preventing member 10 and the upper electrode UE can be secured from the end portion of the conductive deposition preventing member 10 toward the center portion of the same even if the distortion is caused in the conductive deposition preventing member 10. In this manner, according to the feature point of the present second embodiment, the occurrence of the potential difference inside the conductive deposition preventing member 10 can be suppressed. As a result, according to the feature point of the present second embodiment, the unexpected discharge through the space caused by the occurrence of the distortion in the conductive deposition preventing member 10 can be prevented. That is, according to the feature point of the present second embodiment, the defect of the plasma discharge in the discharge space can be suppressed, so that the adverse influence on the formation of the film on the substrate 1S can be suppressed.

As described above, first, the present second embodiment is on the premise of application of such a contrivance for the attachment structure of the conductive deposition preventing member 10 as providing the screws 13 at the positions not overlapping the substrate 1S in plane, the screws 13 fixing the conductive deposition preventing member 10 to the upper electrode UE. In this manner, the quality of the film formed on the substrate 1S can be prevented from being adversely influenced by the film (foreign substances) peeled off from the portions fixed by the screws 13. In the present second embodiment, for example, the conductive member 15 having the stretch property in the z direction is arranged at the position overlapping the substrate 1S in plane so as to be sandwiched between the upper electrode UE and the conductive deposition preventing member 10. This manner can suppress side effects caused by the application of such a contrivance for the attachment structure of the conductive deposition preventing member 10 as providing the screws 13 at the positions not overlapping the substrate 1S in plane, the screws 13 fixing the conductive deposition preventing member 10 to the upper electrode UE. That is, side effects are caused when the screws 13 fixing the conductive deposition preventing member 10 to the upper electrode UE are provided at the positions not overlapping the substrate 1S in plane, the side effects causing the distortion in the conductive deposition preventing member 10 due to the large-size substrate 1S to undesirably cause the unexpected discharge in the space between the conductive deposition preventing member 10 and the upper electrode UE due to the distortion.

Regarding this point, in the present second embodiment, while the screws 13 fixing the conductive deposition preventing member 10 to the upper electrode UE are provided at the positions not overlapping the substrate 1S in plane, the conductive member 15 having the stretch property in the z direction is arranged at the position overlapping the substrate 1S in plane so as to be sandwiched between the upper electrode UE and the conductive deposition preventing member 10. According to the present second embodiment, this manner can prevent the occurrence of the unexpected discharge based on the ununiformity of the electrical contact between the conductive deposition preventing member 10 and the upper electrode UE due to the distortion of the conductive deposition preventing member 10 while reducing the potential which may cause the adsorption of the foreign substances on the substrate 1S, the foreign substances being caused from the portions fixed by the screws 13 as the source of generation.

Figure 13:
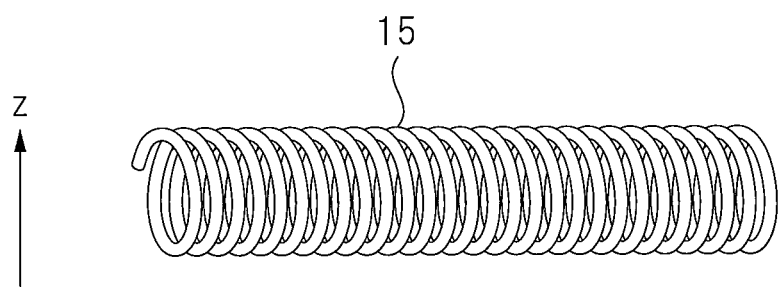
FIG. 13 is a schematic view showing one example of a conductive member according to the second embodiment.
Figure 14:
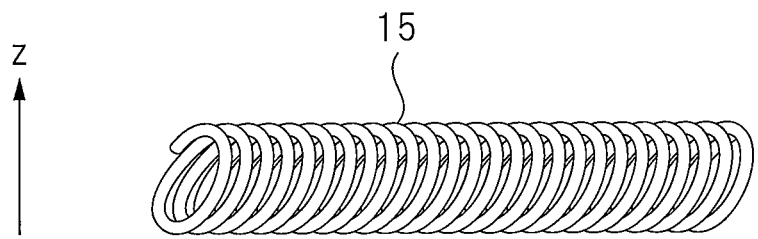
FIG. 14 is a schematic view showing one example of a conductive member according to the second embodiment.

FIG. 13 is a schematic view showing one example of the conductive member 15 according to the present second embodiment. As shown in FIG. 13, the conductive member 15 according to the present second embodiment has, for example, a coil shape. The conductive member 15 according to the present second embodiment formed as described above is, for example, deformable in the z direction as shown in FIGS. 13 and 14. That is, as shown in FIGS. 13 and 14, the conductive member 15 according to the present second embodiment has the stretch property in the z direction. This conductive member 15 can be formed by, for example, coating a surface of a coil-shaped rubber with a conductive material represented by a metal.

Figure 15A:
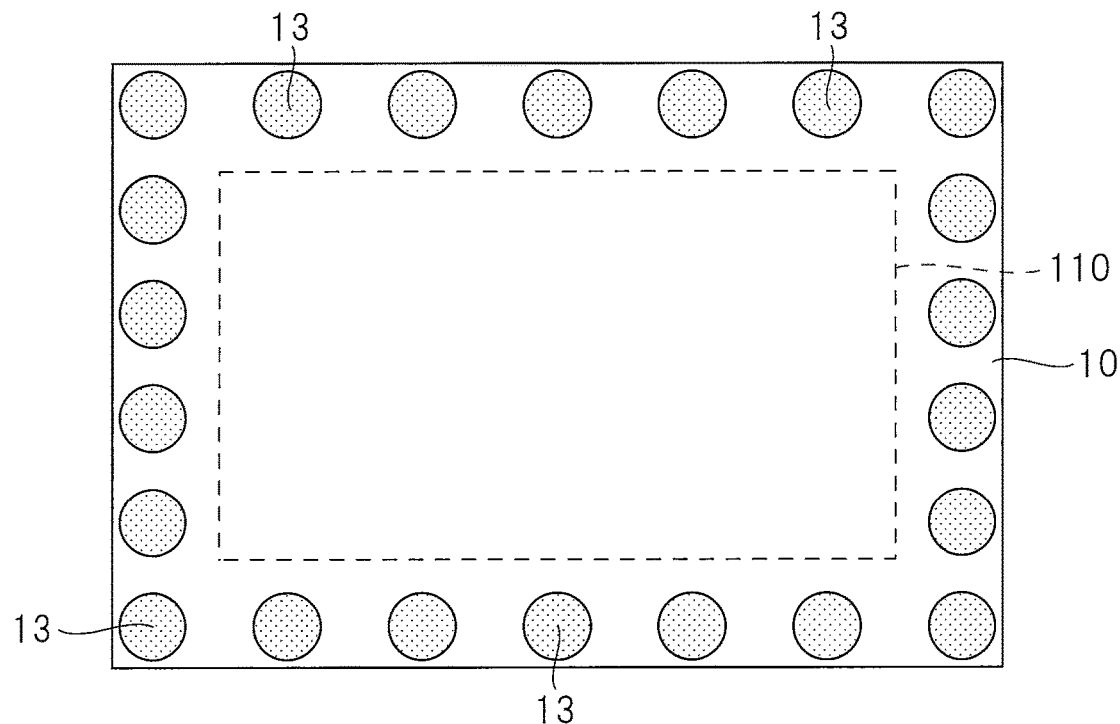
FIG. 15A is a plan view of a conductive deposition preventing member as viewed from a solid-line arrow direction shown in FIG. 12.

FIG. 15A is a plan view of the conductive deposition preventing member 10 as viewed from a direction of a solid-line arrow in FIG. 12. In FIG. 15A, a plan shape of the conductive deposition preventing member 10 is rectangular, and the plurality of screws 13 are arranged in an outer edge region of the conductive deposition preventing member 10. In FIG. 15A, a region 110 encircled with a broken line indicates, for example, a region overlapping the substrate 1S in FIG. 12 in plane. Therefore, the plurality of screws 13 arranged in the outer edge region of the conductive deposition preventing member 10 do not overlap the substrate 1S in FIG. 12 in plane.

Figure 15B:
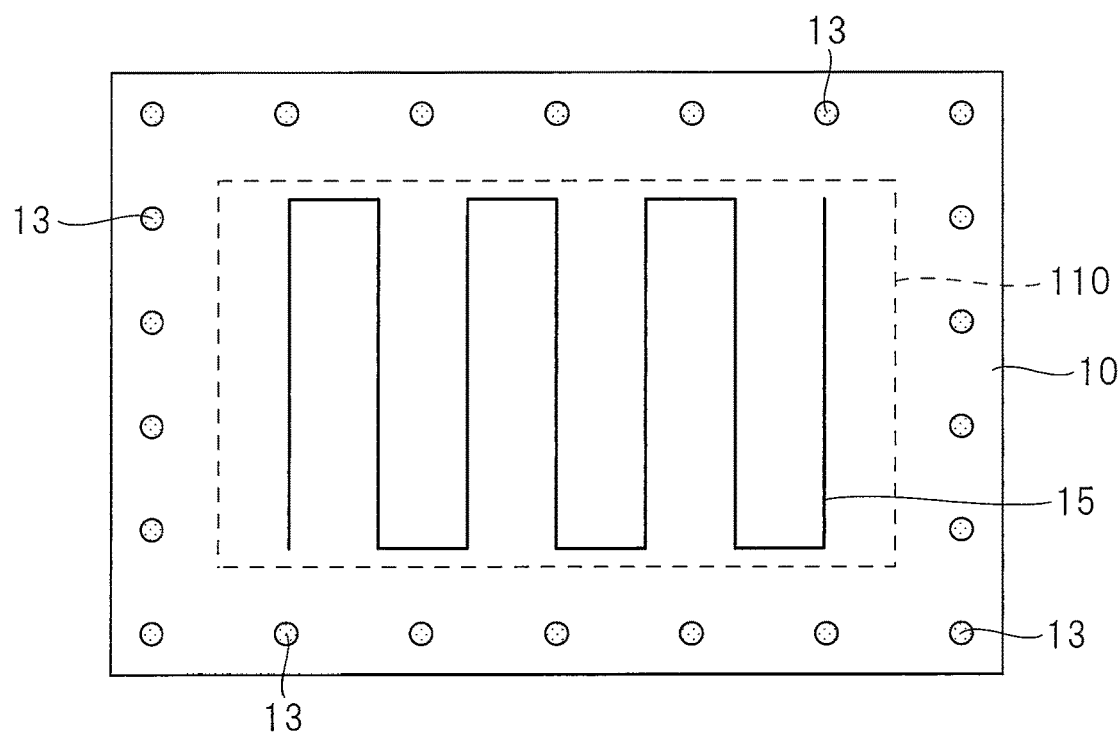
FIG. 15B is a plan view of a conductive deposition preventing member as viewed from a broken-line arrow direction shown in FIG. 12.
Figure 16:
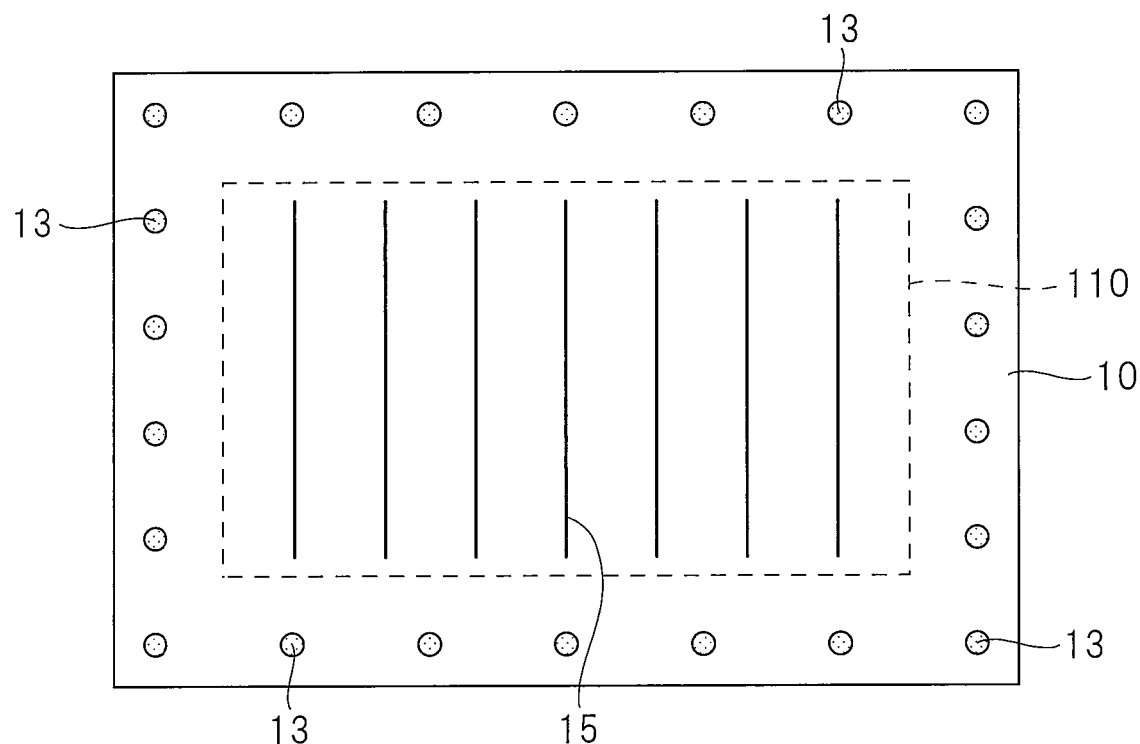
FIG. 16 is a diagram showing a modification example of a conductive member.
Figure 17:
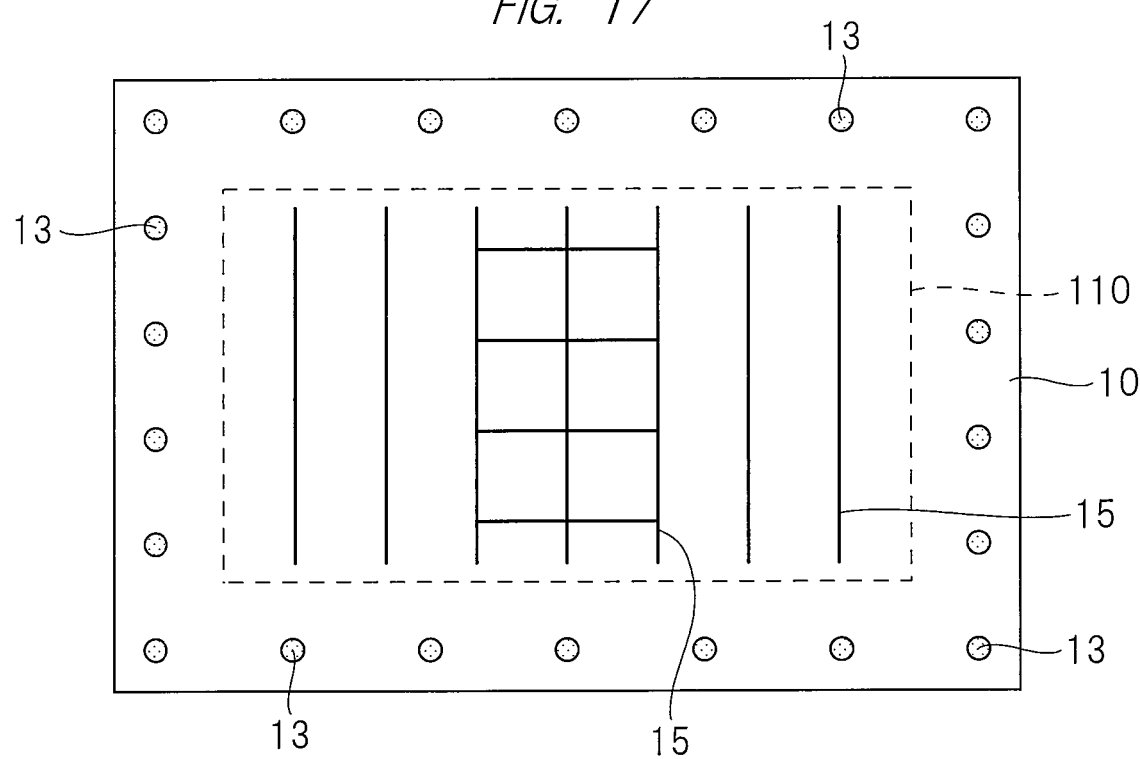
FIG. 17 is a diagram showing a modification example of a conductive member.

Subsequently, FIG. 15B is a plan view of the conductive deposition preventing member 10 as viewed from a direction of a broken-line arrow in FIG. 12. In FIG. 15B, the region 110 overlapping the substrate 1S in plane is illustrated with a broken line, and a meander-shape conductive member 15 is arranged so as to overlap this region 110 in plane. Note that the shape of the conductive member 15 arranged so as to overlap this region 110 in plane is not limited to the meander shape shown in FIG. 15B. For example, as shown in FIG. 16, the conductive member 15 according to the present second embodiment may be formed into a linear shape. In this case, a plurality of conductive members 15 each of which is formed into the linear shape are arranged with a predetermined interval. Further, in the present second embodiment, combination of a ladder-shape conductive member 15 and the linear-shape conductive member 15 can be arranged so as to overlap the region 110 in plane.

Third Embodiment

A plasma atomic layer deposition apparatus according to the present third embodiment has the feature point of the above-described first embodiment and the feature point of the above-described second embodiment.

Specifically, FIG. 18 is a schematic view showing principle components of the plasma atomic layer deposition apparatus according to the present third embodiment. In FIG. 18, a conductive deposition preventing member 10a is fixed to a lower surface of the upper electrode UE by a plurality of screws 13a, and a conductive deposition preventing member 10b is fixed to a lower surface of the conductive deposition preventing member 10a by a plurality of screws 13b. At this time, in the present third embodiment, for example, the plurality of screws 13a and the plurality of screws 13b do not overlap each other as shown in FIG. 18.

In this manner, a path 1000c illustrated with a thick arrow in FIG. 18 is much longer than the path 1000a illustrated with the thick arrow in FIG. 3. This means that a gas infiltration distance from the discharge space to the upper electrode UE itself increases also in the present third embodiment. Therefore, even in the plasma atomic layer deposition apparatus having such characteristics as the formation of the film also in the small space, the adhesion of the film on the upper electrode UE itself can be effectively prevented by the application of the same feature point as that of the above-described first embodiment. As a result, also in the plasma atomic layer deposition apparatus according to the present third embodiment, a frequency of execution of the maintenance work detaching the upper electrode UE to remove the film adhered to the upper electrode UE is reduced. Thus, the change in the film-forming conditions due to the change in the attachment position of the upper electrode UE can be suppressed. As a result, by the application of the same feature point as that of the above-described first embodiment also in the present third embodiment, the change in the quality of the film formed on the substrate 1S can be suppressed. From the above description, the film having the good quality can be formed on the substrate 1S also in the plasma atomic layer deposition apparatus according to the present third embodiment.

Further, the present third embodiment has been made in the assumption of the application of such a contrivance as providing the screws 13b at the position not overlapping the substrate 1S in plane, the screws fixing the conductive deposition preventing member 10b to the conductive deposition preventing member 10a. This manner can suppress the adverse influence on the quality of the film formed on the substrate 1S due to the film (foreign substances) peeled off from the portions fixed by the screws 13b.

Also in the present third embodiment, for example, as shown in FIG. 18, the conductive member 15 having the stretch property in the z direction is arranged at the position overlapping the substrate 1S in plane so as to be sandwiched between the conductive deposition preventing member 10a and the conductive deposition preventing member 10b. Also in the present third embodiment, this manner can prevent the occurrence of the unexpected discharge based on the ununiformity of the electrical contact between the conductive deposition preventing member 10a and the conductive deposition preventing member 10b due to the distortion of the conductive deposition preventing member 10b while reducing the potential which may cause the adsorption of the foreign substances on the substrate 1S, the foreign substances being caused from the portions fixed by the screws 13b as the source of generation.

As shown in FIG. 18, in the plasma atomic layer deposition apparatus according to the present third embodiment, note that the conductive member 15 having the stretch property in the z direction is arranged at the position overlapping the substrate 1S in plane so as to be sandwiched between the conductive deposition preventing member 10a and the conductive deposition preventing member 10b. Therefore, even when the screws 13b fixing the conductive deposition preventing member 10b to the conductive deposition preventing member 10a are provided only at the positions not overlapping the substrate 1S in plane, the ununiformity of the electrical contact between the conductive deposition preventing member 10a and the conductive deposition preventing member 10b due to the distortion of the conductive deposition preventing member 10b can be suppressed. That is, it can be said that the configuration shown in FIG. 18 is desirable from the viewpoint of the suppression of the adverse influence on the quality of the film formed on the substrate 1S due to the film (foreign substances) peeled off from the portions fixed by the screws 13b.

However, even when the screws 13b fixing the conductive deposition preventing member 10b to the conductive deposition preventing member 10a are provided also at the positions overlapping the substrate 1S in plane, the number of the screws 13b provided at the positon overlapping the substrate 1S in plane can be made smaller than the number of the plurality of screws 13a by the application of the configuration of the arrangement of the conductive member 15 having the stretch property in the z direction so as to be sandwiched between the conductive deposition preventing member 10a and the conductive deposition preventing member 10b. Also in this case, the occurrence of the unexpected discharge based on the ununiformity of the electrical contact between the conductive deposition preventing member 10a and the conductive deposition preventing member 10b due to the distortion of the conductive deposition preventing member 10b can be prevented. Further, also in this configuration, the number of the screws 13b arranged in the region overlapping the substrate 1S in plane can be made small although not being smaller than that in the configuration shown in FIG. 18, and therefore, the potential which may cause the foreign substances due to the peeling off of the film adhered to the portions fixed by the screws 13b can be reduced.

In the foregoing, the invention made by the present inventors has been concretely described based on the embodiments. However, it is needless to say that the present invention is not limited to the foregoing embodiments, and various modifications can be made within the scope of the present invention.

What is claimed is:

1. An atomic layer deposition apparatus configured to supply gas to a film formation space having a top, a bottom and at least two opposing sides, the gas being supplied from one of the sides of the film formation space, comprising:
    a first electrode holding a substrate;
    a second electrode having an opposite surface opposed to the first electrode and generating plasma discharge between the second electrode and the first electrode;
    a first conductive deposition preventing member fixed to the opposite surface of the second electrode by a plurality of first connecting members; and
    a second conductive deposition preventing member fixed to the first conductive deposition preventing member by a plurality of second connecting members,
    wherein, in a plan view, the plurality of first connecting members and the plurality of second connecting members are arranged so as not to overlap each other and
    wherein an entire upper surface of the first conductive deposition preventing member is in close contact with the opposite surface of the second electrode.

2. The atomic layer deposition apparatus according to claim 1,
    wherein the number of the plurality of second connecting members is smaller than the number of the plurality of first connecting members.

3. The atomic layer deposition apparatus according to claim 1,
    wherein, in a plan view, the plurality of second connecting members are arranged at positions that are distant from the substrate.

4. The atomic layer deposition apparatus according to claim 1,
    wherein the atomic layer deposition apparatus has an insulating deposition preventing member that is distant from and surrounds the second electrode in a plan view.

5. The atomic layer deposition apparatus according to claim 4,
    wherein a space exists between the insulating deposition preventing member and the first conductive deposition preventing member and between the insulating deposition preventing member and the second conductive deposition preventing member, and
    the atomic layer deposition apparatus has an inert-gas supply unit supplying inert gas to the space.

6. The atomic layer deposition apparatus according to claim 1,
    wherein the atomic layer deposition apparatus further has a conductive member having a stretch property provided between the second electrode and the first conductive deposition preventing member.

7. The atomic layer deposition apparatus according to claim 1,
- wherein each of the plurality of first connecting members is a first screw inserted from a first through hole penetrating the first conductive deposition preventing member to a first groove provided to the second electrode, and
- each of the plurality of second connecting members is a second screw inserted from a second through hole penetrating the second conductive deposition preventing member to a second groove provided to the first conductive deposition preventing member.

8. An atomic layer deposition apparatus configured to supply gas to a film formation space having a top, a bottom and at least two opposing sides, the gas being supplied from one of the sides to the film forming space, comprising:
- a first electrode holding a substrate;
- a second electrode having an opposite surface opposed to the first electrode and generating plasma discharge between the second electrode and the first electrode;
- a first conductive deposition preventing member fixed to the opposite surface of the second electrode by a plurality of first connecting members; and
- a second conductive deposition preventing member fixed to the first conductive deposition preventing member by a plurality of second connecting members,
- wherein, in a plan view, the plurality of first connecting members and the plurality of second connecting members are arranged so as to be distant from each other and
- wherein an entire upper surface of the first conductive deposition preventing member is in close contact with the opposite surface of the second electrode.

* * * * *